United States Patent
Gao et al.

(10) Patent No.: US 11,917,928 B2
(45) Date of Patent: Feb. 27, 2024

(54) METHOD FOR PREPARING A JOSEPHSON JUNCTION, APPARATUS, AND DEVICE, AND SUPERCONDUCTING DEVICE

(71) Applicant: ALIBABA GROUP HOLDING LIMITED, Grand Cayman (KY)

(72) Inventors: Ran Gao, Hangzhou (CN); Jin Qin, Hangzhou (CN); Chunqing Deng, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 86 days.

(21) Appl. No.: 17/507,099

(22) Filed: Oct. 21, 2021

(65) Prior Publication Data

US 2022/0140223 A1 May 5, 2022

(30) Foreign Application Priority Data

Oct. 29, 2020 (CN) .......................... 202011187173.0

(51) Int. Cl.
*H10N 60/01* (2023.01)
*H10N 60/12* (2023.01)
(Continued)

(52) U.S. Cl.
CPC ......... *H10N 60/0912* (2023.02); *H10N 60/12* (2023.02); *H10N 60/805* (2023.02); *H10N 69/00* (2023.02)

(58) Field of Classification Search
CPC ........................... H10N 60/0912; H10N 69/00
See application file for complete search history.

(56) References Cited

U.S. PATENT DOCUMENTS

| 4,370,359 A | 1/1983 | Fetter et al. |
| 2007/0158791 A1 | 7/2007 | Wakana et al. |

(Continued)

FOREIGN PATENT DOCUMENTS

| CN | 104701451 A | 6/2015 |
| CN | 111244259 A | 6/2020 |

(Continued)

OTHER PUBLICATIONS

PCT International Search Report and Written Opinion dated Jan. 26, 2022, issued in corresponding International Application No. PCT/US2021/055996 (10 pgs.).

(Continued)

*Primary Examiner* — Matthew L Reames
(74) *Attorney, Agent, or Firm* — Finnegan, Henderson, Farabow, Garrett & Dunner, LLP

(57) ABSTRACT

Methods, apparatuses, and devices for Josephson junction preparation includes: obtaining a first pattern structure for generating a first Josephson junction of a first type and a plurality of second pattern structures for generating a plurality of second Josephson junctions of a second type; evaporating a material on the first pattern structure and the plurality of second pattern structures based on a first evaporation direction to generate a first electrode layer for implementing information transmission; forming an insulating layer on the first electrode layer, the insulating layer including a compound corresponding to the material; evaporating the material on the first pattern structure and the plurality of second pattern structures based on a second evaporation direction to generate a second electrode layer for implementing information transmission; and forming the first Josephson junction and the plurality of second Josephson junctions.

14 Claims, 18 Drawing Sheets

(51) Int. Cl.
 *H10N 60/80* (2023.01)
 *H10N 69/00* (2023.01)

(56) References Cited

U.S. PATENT DOCUMENTS

2020/0168782 A1    5/2020  Adiga et al.
2022/0037578 A1*   2/2022  Rodbell ............ H10N 60/0912

FOREIGN PATENT DOCUMENTS

| CN | 111554798 A | 8/2020 |
| CN | 111613661 A | 9/2020 |
| CN | 113257989 A | 8/2021 |
| WO | WO 2017/217959 A1 | 12/2017 |

OTHER PUBLICATIONS

First Office Action issued in corresponding Chinese Application No. 202011187173.0 dated Oct. 24, 2023 (7 pages).

* cited by examiner

600

---

Obtain first pattern structure for generating first Josephson junction of first type and plurality of second pattern structures for generating plurality of second Josephson junctions of second type — 602

↓

Evaporate material on first pattern structure and plurality of second pattern structures based on first evaporation direction to generate first electrode layer for implementing information transmission — 604

↓

Form insulating layer on first electrode layer, insulating layer comprising compound corresponding to material — 606

↓

Evaporate material on first pattern structure and plurality of second pattern structures based on second evaporation direction to generate second electrode layer for implementing information transmission — 608

↓

Form first Josephson junction and plurality of second Josephson junctions — 610

| Obtain mask plate for preparing wafer-level Josephson junction, mask plate comprising first mask region for preparing first Josephson junction and plurality of second mask regions for preparing plurality of second Josephson junctions | — 702 |

↓

| Obtain first pattern structure through first mask region, and obtain plurality of second pattern structures through plurality of second mask regions | — 704 |

FIG. 7

METHOD FOR PREPARING A JOSEPHSON JUNCTION, APPARATUS, AND DEVICE, AND SUPERCONDUCTING DEVICE

CROSS-REFERENCE TO RELATED APPLICATIONS

The present disclosure claims benefits of and priority to Chinese patent application No. 202011187173.0, filed on Oct. 29, 2020, the content of which is incorporated herein by reference in its entirety.

TECHNICAL FIELD

The present disclosure relates to the technical field of superconducting circuits, and in particular, to a method for preparing a Josephson junction, apparatus, and device, and a superconducting device.

BACKGROUND

A Josephson junction, or referred to as a superconducting tunnel junction, is generally a structure including two superconductors sandwiching a very thin barrier layer, such as a Josephson junction formed by a superconductor (S)-insulator (I)-superconductor (S) structure, referred to as SIS. The above Josephson junction is a key component for the realization and application of modern quantum computing. Specifically, in a superconducting quantum computer, superconducting qubits that perform logical operations can be constructed by making one or more Josephson junctions and adding some other additional circuit elements (such as capacitance elements and inductance elements) at the same time. Therefore, the preparation quality of the Josephson junction is the key to the generation of superconducting qubits.

At present, a preparation method for the Josephson junction usually uses a mask plate to perform shadow evaporation. However, when the above method is used to prepare a Josephson junction, the quality of the Josephson junction largely depends on precise control on the thickness of photoresist and on an evaporation direction. If the evaporation direction changes or the thickness of the photoresist changes, the junction quality of the Josephson junction will change. Therefore, the preparation quality of the Josephson junction cannot be guaranteed.

SUMMARY

The embodiments of present disclosure provide methods, apparatuses, and devices for Josephson junction preparation as well as a superconducting circuit. In an aspect, a method for preparing a Josephson junction includes obtaining a first pattern structure for generating a first Josephson junction of a first type and a plurality of second pattern structures for generating a plurality of second Josephson junctions of a second type, wherein a junction area of the first Josephson junction is different from a junction area of at least one of the plurality of second Josephson junctions; evaporating a material on the first pattern structure and the plurality of second pattern structures based on a first evaporation direction to generate a first electrode layer for implementing information transmission, wherein the first evaporation direction is substantially parallel to an edge of the first pattern structure and an edge of at least one of the plurality of second pattern structures; forming an insulating layer on the first electrode layer, the insulating layer including a compound corresponding to the material; evaporating the material on the first pattern structure and the plurality of second pattern structures based on a second evaporation direction to generate a second electrode layer for implementing information transmission, wherein the second evaporation direction is substantially parallel to the edge of the first pattern structure and the edge of the at least one of the plurality of second pattern structures; and forming the first Josephson junction based on the first electrode layer generated on the first pattern structure, the insulating layer, and the second electrode layer generated on the first pattern structure, and forming the plurality of second Josephson junctions based on the first electrode layer generated on the plurality of second pattern structures, the insulating layer, and the second electrode layer generated on the plurality of second pattern structures.

In another aspect, an apparatus for preparing a Josephson junction includes: at least one circuitry configured for obtaining a first pattern structure for generating a first Josephson junction of a first type and a plurality of second pattern structures for generating a plurality of second Josephson junctions of a second type, wherein a junction area of the first Josephson junction is different from a junction area of at least one of the plurality of second Josephson junctions; causing the apparatus to evaporate a material on the first pattern structure and the plurality of second pattern structures based on a first evaporation direction to generate a first electrode layer for implementing information transmission, wherein the first evaporation direction is substantially parallel to an edge of the first pattern structure and an edge of at least one of the plurality of second pattern structures; causing the apparatus to form an insulating layer on the first electrode layer, the insulating layer including a compound corresponding to the material; causing the apparatus to evaporate the material on the first pattern structure and the plurality of second pattern structures based on a second evaporation direction to generate a second electrode layer for implementing information transmission, wherein the second evaporation direction is substantially parallel to the edge of the first pattern structure and the edge of the at least one of the plurality of second pattern structures; and causing the apparatus to form the first Josephson junction based on the first electrode layer generated on the first pattern structure, the insulating layer, and the second electrode layer generated on the first pattern structure, and to form the plurality of second Josephson junctions based on the first electrode layer generated on the plurality of second pattern structures, the insulating layer, and the second electrode layer generated on the plurality of second pattern structures.

In yet another aspect, a device for preparing a Josephson junction includes at least one processor and a memory configured to store a set of instructions executable by the at least one processor to cause the device to perform: obtaining a first pattern structure for generating a first Josephson junction of a first type and a plurality of second pattern structures for generating a plurality of second Josephson junctions of a second type, wherein a junction area of the first Josephson junction is different from a junction area of at least one of the plurality of second Josephson junctions; evaporating a material on the first pattern structure and the plurality of second pattern structures based on a first evaporation direction to generate a first electrode layer for implementing information transmission, wherein the first evaporation direction is substantially parallel to an edge of the first pattern structure and an edge of at least one of the plurality of second pattern structures; forming an insulating layer on the first electrode layer, the insulating layer including a_ compound corresponding to the material; evaporating the material on the first pattern structure and the plurality of second pattern structures based on a second evaporation direction to generate a second electrode layer for implementing information transmission, wherein the second evaporation direction is substantially parallel to the edge of the first pattern structure and the edge of the at least one of the plurality of second pattern structures; and forming the first Josephson junction based on the first electrode layer generated on the first pattern structure, the insulating layer, and the second electrode layer generated on the first pattern structure, and forming the plurality of second Josephson junctions based on the first electrode layer generated on the plurality of second pattern structures, the insulating layer, and the second electrode layer generated on the plurality of second pattern structures.

In yet another aspect, a superconducting circuit includes a first Josephson junction of a first type connected in parallel to a plurality of second Josephson junctions of a second type, wherein the plurality of second Josephson junctions are connected in series, and wherein the first Josephson junction and the plurality of second Josephson junctions are generated by a method. The method includes obtaining a first pattern structure for generating a first Josephson junction of a first type and a plurality of second pattern structures for generating a plurality of second Josephson junctions of a second type, wherein a junction area of the first Josephson junction is different from a junction area of at least one of the plurality of second Josephson junctions; evaporating a material on the first pattern structure and the plurality of second pattern structures based on a first evaporation direction to generate a first electrode layer for implementing information transmission, wherein the first evaporation direction is substantially parallel to an edge of the first pattern structure and an edge of at least one of the plurality of second pattern structures; forming an insulating layer on the first electrode layer, the insulating layer including a compound corresponding to the material; evaporating the material on the first pattern structure and the plurality of second pattern structures based on a second evaporation direction to generate a second electrode layer for implementing information transmission, wherein the second evaporation direction is substantially parallel to the edge of the first pattern structure and the edge of the at least one of the plurality of second pattern structures; and forming the first Josephson junction based on the first electrode layer generated on the first pattern structure, the insulating layer, and the second electrode layer generated on the first pattern structure, and forming the plurality of second Josephson junctions based on the first electrode layer generated on the plurality of second pattern structures, the insulating layer, and the second electrode layer generated on the plurality of second pattern structures.

BRIEF DESCRIPTION OF THE DRAWINGS

To describe the technical solutions in the embodiments of the present disclosure more clearly, the accompanying drawings required for describing the embodiments are briefly introduced below. It is apparent that the accompanying drawings described in the following are merely some embodiments of the present disclosure, and those of ordinary skill in the art can still derive other drawings from these accompanying drawings without creative efforts.

FIG. 6 is a flowchart illustrating a method for preparing a Josephson junction, consistent with some embodiments of this disclosure.

FIG. 7 is a flowchart illustrating a method of obtaining a first pattern structure and a plurality of second pattern structures, consistent with some embodiments of this disclosure.

DETAILED DESCRIPTION

Figure 1:
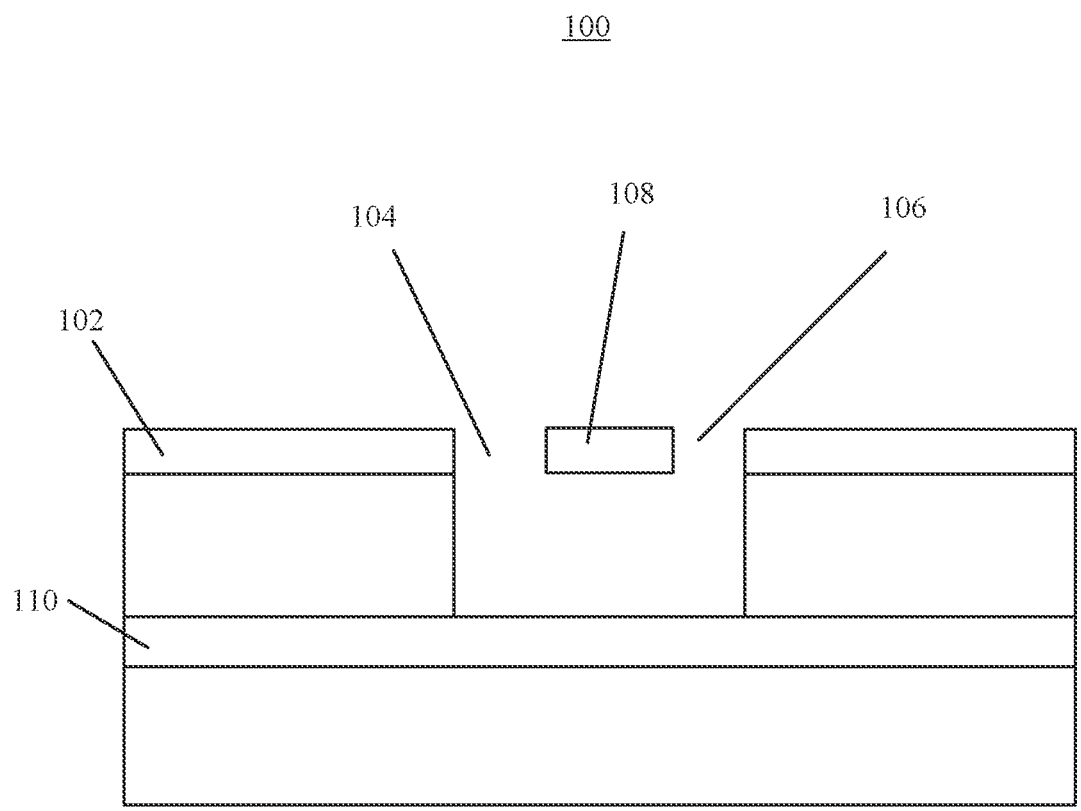
FIGS. 1-3 are schematic diagrams illustrating a process of preparing a Josephson junction.

Reference can now be made in detail to example embodiments, examples of which are illustrated in the accompanying drawings. The following description refers to the accompanying drawings in which the same numbers in different drawings represent the same or similar elements unless otherwise represented. The implementations set forth in the following description of example embodiments do not represent all implementations consistent with the disclosure. Instead, they are merely examples of apparatuses and methods consistent with aspects related to the disclosure as recited in the appended claims. Particular aspects of present disclosure are described in greater detail below. The terms and definitions provided herein control, if in conflict with terms or definitions incorporated by reference.

The terminology used in the embodiments of the present disclosure is for the purpose of describing particular embodiments only, and is not intended to limit the present disclosure. The singular forms "a," "said," and "the" used in the embodiments of the present disclosure and the appended claims are also intended to include plural forms, unless other meanings are clearly indicated in the context, and "multiple" generally includes at least two, but does not exclude the case of including at least one.

It should be noted that, the relational terms herein such as "first" and "second" are used only to differentiate an entity or operation from another entity or operation, and do not require or imply any actual relationship or sequence between these entities or operations. Moreover, the words "comprising," "having," "containing," and "including," and other similar forms are intended to be equivalent in meaning and be open ended in that an item or items following any one of these words is not meant to be an exhaustive listing of such item or items, or meant to be limited to only the listed item or items.

As used herein, unless specifically stated otherwise, the term "or" encompasses all possible combinations, except where infeasible. For example, if it is stated that a component can include A or B, then, unless specifically stated otherwise or infeasible, the component can include A, or B, or A and B. As a second example, if it is stated that a component can include A, B, or C, then, unless specifically stated otherwise or infeasible, the component can include A, or B, or C, or A and B, or A and C, or B and C, or A and B and C.

Depending on the context, the words "in case of" and "if" as used herein can be interpreted as "at the time of" or "when" or "in response to determination" or "in response to detection." Similarly, depending on the context, the phrase "if determined" or "if detected (a stated condition or event)" can be interpreted as "when determined" or "in response to determination" or "when detected (a stated condition or event)" or "response to detection (of a stated condition or event)."

It should be further noted that the terms "include," "comprise," or any other variations thereof are intended to cover non-exclusive inclusion, so that a commodity or system including a series of elements not only includes the elements, but also includes other elements not explicitly listed, or further includes elements inherent to the commodity or system. In the absence of more limitations, an element defined by "including a/an . . . " does not exclude that the commodity or system including the element further has other identical elements. In addition, the sequence of steps in the following method embodiments is only an example, not a strict limitation.

As used herein, a Josephson junction (also referred to as "a superconducting tunnel junction") can refer to a structure including two superconductors sandwiching a thin barrier layer. By way of example, a Josephson junction can be formed by a superconductor-insulator-superconductor structure (or referred to as an "S-I-S" structure). The Josephson junction can be a key component for implementation and application of modern quantum computing. In some applications, a superconducting quantum computer can utilize a large number (e.g., about 1 million) of superconducting quantum bits ("qubits") to achieve high-precision data operations. The superconducting qubits that perform logical operations can be constructed by preparing one or more Josephson junctions and adding additional circuit elements (e.g., capacitance elements or inductance elements). Therefore, preparing a large number of superconducting qubits with uniform structures can be very important for superconducting quantum computers. One of the keys to producing superconducting qubits is the preparation quality of the Josephson junction (e.g., an area of the Josephson junction, a critical current of the Josephson junction, a non-superconducting normal-state resistance of the Josephson junction, or any other characteristics of the Josephson junction).

Figure 2:
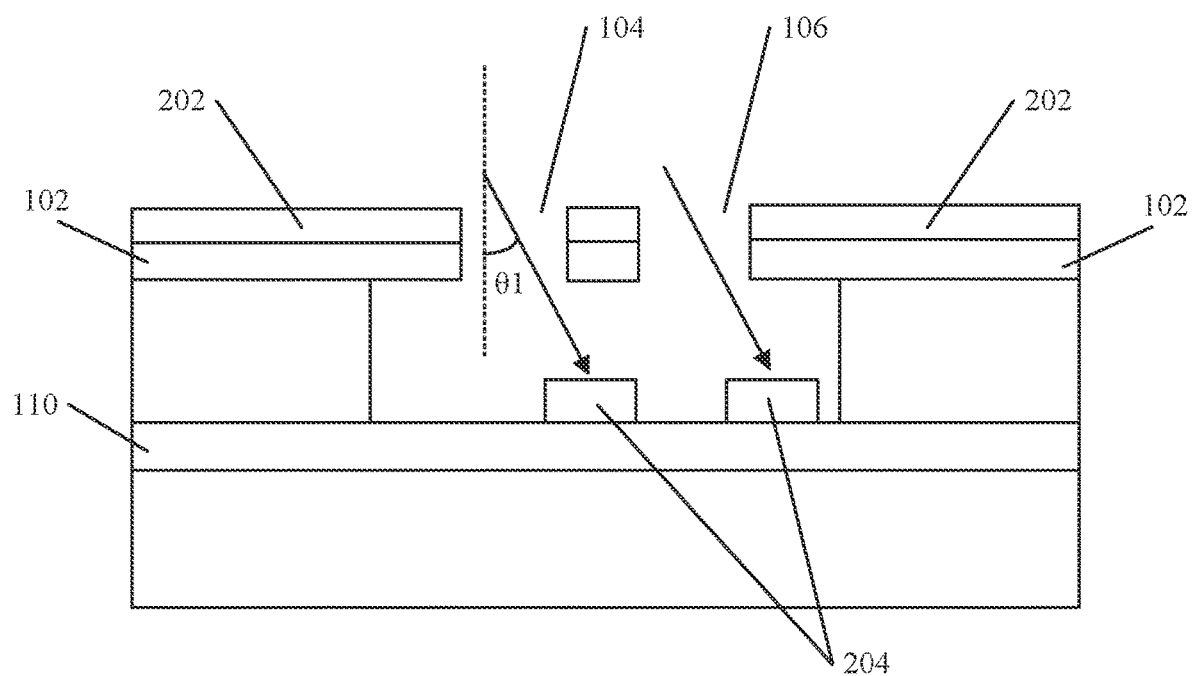
Figure 3:
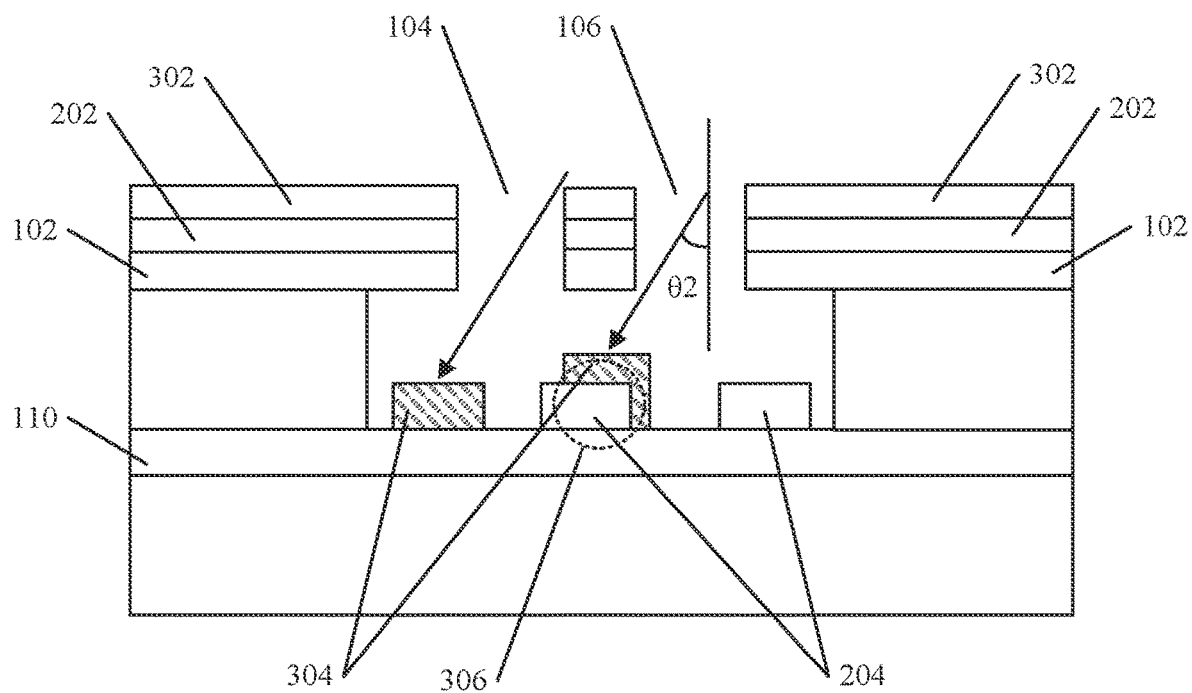

Existing techniques for preparing a Josephson junction typically include shadow evaporation with a mask plate. FIGS. 1-3 are schematic diagrams illustrating a conventional process of preparing a Josephson junction. As shown in FIG. 1, a mask plate 102 can include a first mask pattern 104 and a second mask pattern 106, and a bridge structure 108 is arranged between first mask pattern 104 and second mask pattern 106. Based on mask plate 102 with bridge structure 108, a material can be grown on a bare silicon wafer 110 through first mask pattern 104 to generate a first structure (not shown in FIG. 1).

As shown in FIG. 2, a process of generating a first structure 204 can include growing a first material 202 on mask plate 102 at a first projection angle θ1. First material 202 can be grown on bare silicon wafer 110 through first mask pattern 104 and second mask pattern 106 on the same mask, so that first structure 204 can be generated.

As shown in FIG. 3, a process of generating a second structure 304 can include growing a second material 302 on first material 202 at a second projection angle θ2. Second material 302 can be grown on bare silicon wafer 110 through first mask pattern 104 and second mask pattern 106 on the same mask, so that second structure 304 (represented by a filled pattern) can be generated. The second projection angle θ2 can be different from the first projection angle θ1 (as illustrated in FIG. 2). Accordingly, positions of first structure 204 and second structure 304 on bare silicon wafer 110 can be different, so that an overlapping structure can form between first structure 204 and second structure 304. Such an overlapping structure can form a Josephson junction 306 (represented by a structure enclosed in a dash-line circle in FIG. 3).

When the conventional process described in association with FIGS. 1-3 is used to prepare a Josephson junction, the quality of the Josephson junction can largely depend on precise control of thickness of a photoresist and on precise control of an evaporation direction. If the evaporation direction changes, the quality of the Josephson junction can subject to change (e.g., an area of the Josephson junction, a critical current of the Josephson junction, a non-superconducting normal-state resistance of the Josephson junction, or any other characteristics of the Josephson junction).

Figure 4A:
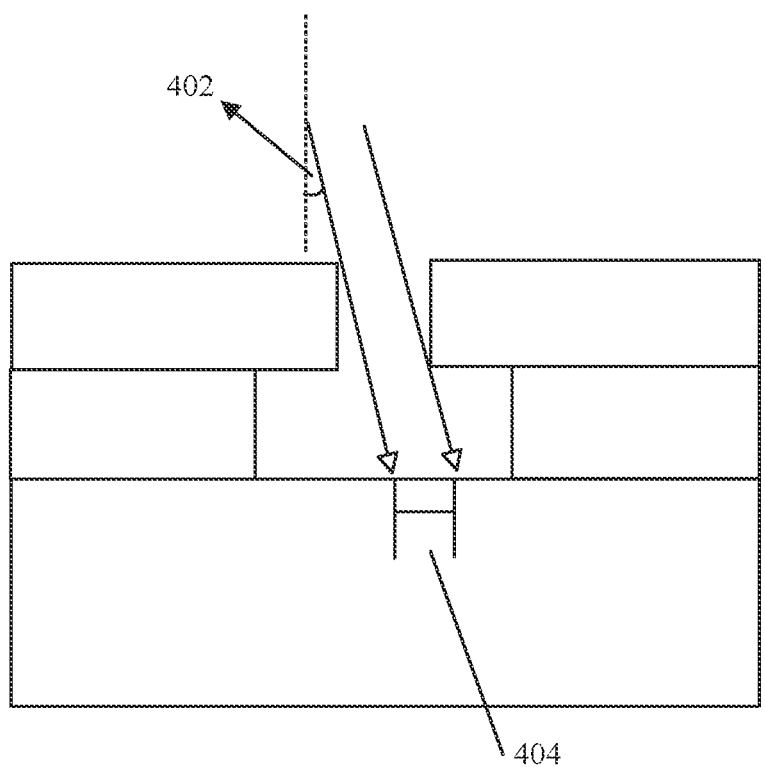
FIG. 4A is a schematic diagram illustrating a process of preparing a Josephson junction using a first projection angle.
Figure 4B:
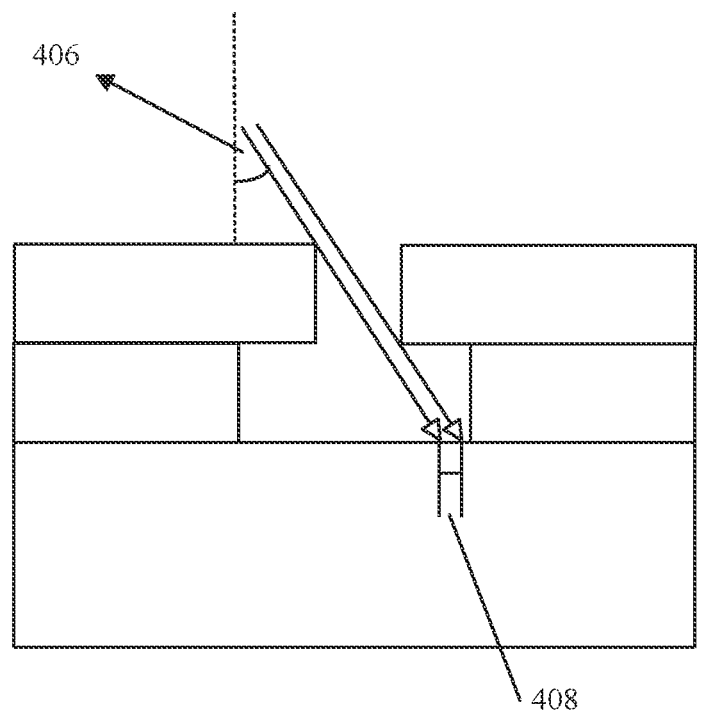
FIG. 4B is a schematic diagram illustrating a process of preparing a Josephson junction using a second projection angle.

FIG. 4A is a schematic diagram illustrating a conventional process of preparing a Josephson junction using a first projection angle 402. As shown in FIG. 4A, for the same photoresist structure and evaporation material, when evaporating the material using first projection angle 402, an electrode layer can be formed on the photoresist layer with a width 404. FIG. 4B is a schematic diagram illustrating a conventional process of preparing a Josephson junction using a second projection angle 406. As shown in FIG. 4B, when evaporating the material using second projection angle 406, an electrode layer can be formed on the photoresist layer with a width 408. When first projection angle 402 and second projection angle 406 are different, width 404 and width 408 can be different. Therefore, during preparation of a plurality of Josephson junctions, the quality of the plurality of Josephson junctions (e.g., areas of the Josephson junctions) can subject to the changes of the projection angle, so that it can be challenging to ensure the preparation quality of the Josephson junction.

Figure 5A:
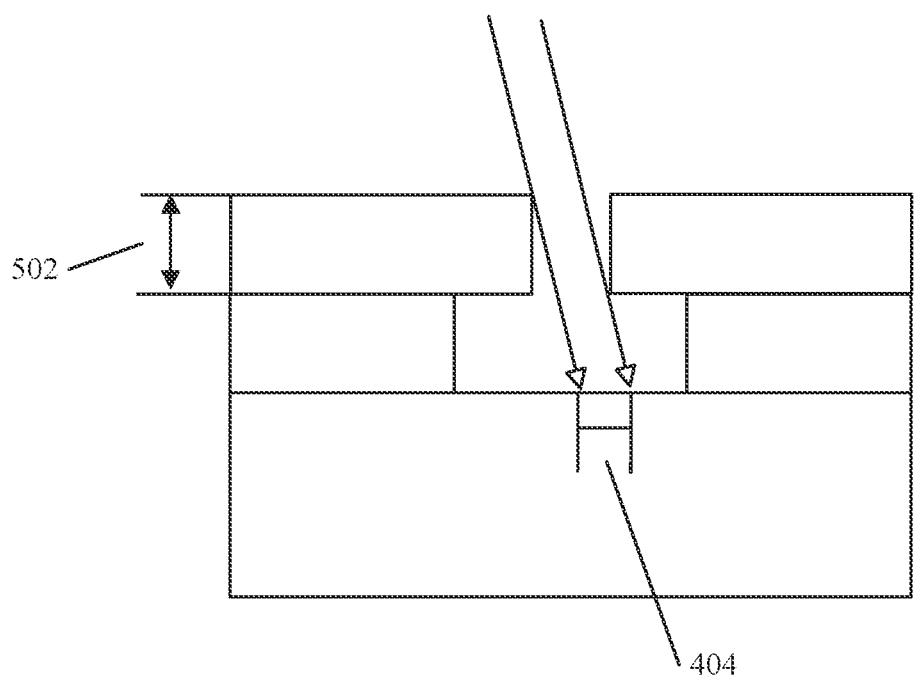
FIG. 5A is a schematic diagram illustrating a process of preparing a Josephson junction using photoresist with a first thickness.
Figure 5B:
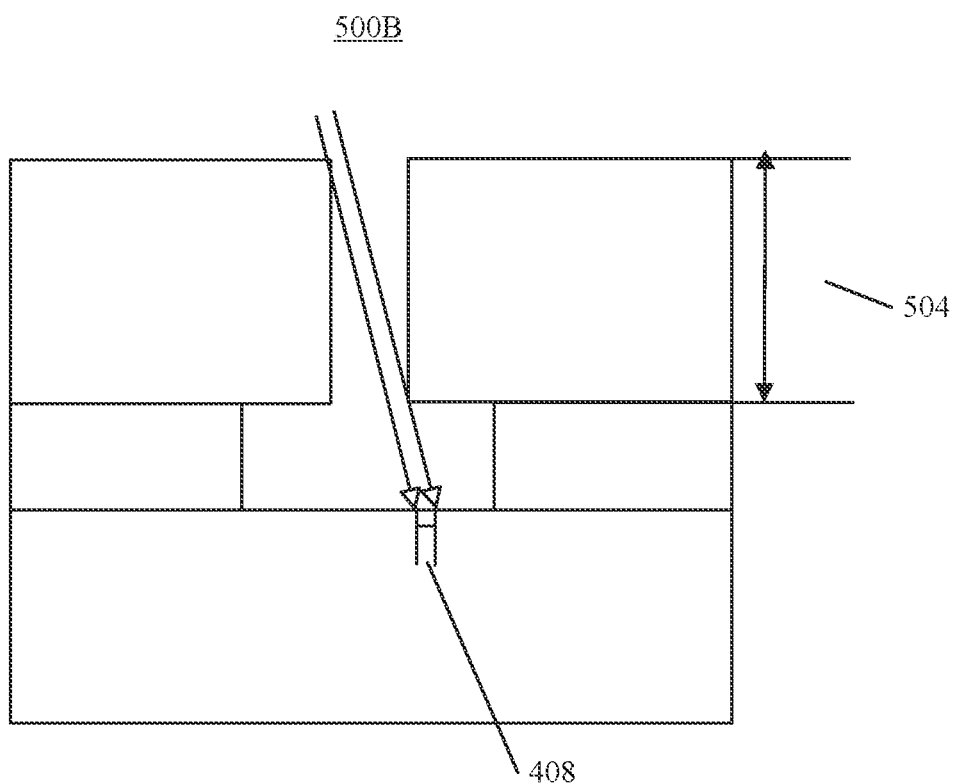
FIG. 5B is a schematic diagram illustrating a process of preparing a Josephson junction using photoresist with a second thickness.

Similarly, the junction quality of the Josephson junction can change depending on the thickness of the photoresist for preparing the Josephson junction. FIG. 5A is a schematic diagram illustrating a conventional process of preparing a Josephson junction using photoresist with a first thickness. As shown in FIG. 5A, for the same projection angle and evaporation material, when evaporating the material on a photoresist structure with a photoresist thickness 502 using a projection angle, an electrode layer can be formed on the photoresist layer with width 404. FIG. 5B is a schematic diagram illustrating a conventional process of preparing a Josephson junction using photoresist with a second thickness. As shown in FIG. 5B, when evaporating the material on a photoresist structure with a photoresist thickness 504 using the same projection angle, an electrode layer can be formed on the photoresist layer with width 408. When photoresist thickness 502 is different from photoresist thickness 504, width 404 and width 408 can also be different. Accordingly, when a plurality of Josephson junctions are prepared using different photoresist thicknesses, the junction quality of the plurality of Josephson junctions (e.g., areas of the Josephson junctions) can subject to changes of the photoresist thicknesses, so that it can be challenging to ensure the preparation quality of the Josephson junction.

As described above, when preparing a Josephson junction, the evaporation angle and the photoresist thickness have great impacts on the quality of the Josephson junction. Specifically, for the wafer-scale manufacturing of a plurality of Josephson junctions, the evaporation angle and the distribution of the photoresist thickness on the entire wafer can impact the quality of the Josephson junctions and can significantly reduce the preparation yield of the Josephson junctions in some cases.

To reduce the influence of the change in the evaporation direction or the photoresist thickness on the quality of the Josephson junction, and to improve the uniformity and preparation yield of the Josephson junction at the wafer scale, methods, apparatuses, devices, superconducting devices for preparing a Josephson junction are provided in the present disclosure. Embodiments of this disclosure can provide multiple technical benefits. The first Josephson junction and the plurality of second Josephson junctions can be prepared simultaneously. Moreover, when the first electrode layer and the second electrode layer are generated, the first evaporation direction can be substantially parallel to the edge of the first pattern structure and the edge of the at least one of the plurality of second pattern structures. The second evaporation direction can be substantially parallel to the edge of the first pattern structure and the edge of the at least one of the plurality of second pattern structures. By doing so, the influence of the evaporation direction or the thickness of the photoresist on the quality of the Josephson junction can be effectively reduced. Accordingly, the quality of the first Josephson junction and the plurality of second Josephson junctions can be ensured, and the uniformity and yield of preparing Josephson junctions can be improved.

Some implementations of the present disclosure will be described in detail below with reference to the accompanying drawings. Provided that there is no conflict between the embodiments, the following embodiments and features in the embodiments can be combined with each other.

FIG. 6 is a flowchart illustrating a method 600 for preparing a Josephson junction, consistent with some embodiments of this disclosure. Method 600 can be used for preparing a wafer-level Josephson junction. Also, any apparatus capable of performing method 600 can be used for preparing a wafer-level Josephson junction. It is understandable that the apparatus for preparing a Josephson junction can be implemented as software, hardware, or a combination of software and hardware. In some embodiments, method 600 can be implemented by at least one circuitry of the apparatus.

At step 602, a first pattern structure for generating a first Josephson junction of a first type and a plurality of second pattern structures for generating a plurality of second Josephson junctions of a second type are obtained. A junction area of the first Josephson junction can be different from a junction area of at least one of the plurality of second Josephson junctions.

In some embodiments, different Josephson junctions can correspond to different junction areas. In order to facilitate the preparation of Josephson junctions while ensuring the uniformity and preparation yield of the Josephson junctions, the Josephson junctions can be classified into the first Josephson junction and the plurality of second Josephson junctions, and the junction area of the first Josephson junction can be different from the junction area of the at least one of the plurality of second Josephson junctions.

By way of example, the junction area of the first Josephson junction can be smaller than or equal to a preset area, and the junction area of the at least one of the plurality of second Josephson junctions can be greater than the preset area. In such cases, the first Josephson junction can be referred to as a "small junction," and the plurality of second Josephson junctions can be referred to as "big junctions."

In another example, the junction area of the first Josephson junction can be greater than the preset area, and the junction area of the at least one of the plurality of second Josephson junctions can be less than or equal to the preset area. In such cases, the first Josephson junction can be referred to as a "big junction," and the plurality of second Josephson junctions can be referred to as "small junctions."

For ease of description without causing ambiguities, the following description takes the first Josephson junction as the "small junction" and the plurality of second Josephson junctions as the "big junctions" as an example. In such cases, the preset area for distinguishing the first Josephson junction from the plurality of second Josephson junctions can be preset. For example, the preset area can be the largest area that can be realized by the first Josephson junction. It should be noted that the specific numerical range of the preset area is not limited in the example embodiments of this disclosure, and those skilled in the art can set it according to specific application requirements and design requirements, which will not be detailed herein.

In some embodiments, to simultaneously prepare the first Josephson junction and the plurality of second Josephson junctions, the first pattern structure and the plurality of second pattern structures can be prepared in advance, so that the first Josephson junction can be generated based on the first pattern structure, and the plurality of second Josephson junctions can be generated based on the plurality of second pattern structures. It is understandable that the first pattern structure and the plurality of second pattern structures can be the same or different. For example, the first pattern structure can be a symmetrical structure, and at least one of the plurality of second pattern structures can be an asymmetrical structure. In some embodiments, the first pattern structure and the plurality of second pattern structures described herein can be obtained by etching through a mask plate.

In some embodiments, the plurality of second Josephson junctions can be connected in series. The first Josephson junction can be connected in parallel to the plurality of second Josephson junctions. In such cases, the plurality of second Josephson junctions and the first Josephson junction can be used to generate a superconducting device, thereby improving the practicability of the prepared Josephson junction.

Still referring to FIG. 6, at step 604, a material is evaporated on the first pattern structure and the plurality of second pattern structures based on a first evaporation direction to generate a first electrode layer for implementing information transmission. The first evaporation direction can be substantially parallel (e.g., within an error range of ±2°) to an edge of the first pattern structure and an edge of at least one of the plurality of second pattern structures.

In some embodiments, after step 602, a material can be evaporated simultaneously on the first pattern structure and the plurality of second pattern structures based on the first evaporation direction. In some embodiments, the material can include at least one of aluminum, binary nitride, ternary nitride, composite oxide, or any other superconducting materials (e.g., at least one of tantalum, molybdenum, vanadium, or the like). It is understandable that the material is not limited to the examples described herein. Those skilled in the art can also select the material according to specific application requirements and design requirements.

In some embodiments, the first electrode layer for implementing information transmission can be generated by the material evaporated on the first pattern structure and the plurality of second pattern structures. For example, the first electrode layer generated in the first pattern structure can be used to generate the first Josephson junction, and the first electrode layer generated in the plurality of second pattern structures can be used to generate the plurality of second Josephson junctions.

In some embodiments, the first evaporation direction can be substantially parallel (e.g., within an error range of ±2°) to the edge of the first pattern structure and the edge of the at least one of the plurality of second pattern structures. By doing so, the influence of the evaporation angle and the photoresist thickness on the preparation quality of the Josephson junction can be reduced in the process of preparing the first Josephson junction and the plurality of second Josephson junctions. By way of example, an angle formed between the first evaporation direction and a gravity direction can be greater than or equal to 100 and less than or equal to 60°. It is noted that the first evaporation direction is not limited to the example embodiments described herein and can be set by those skilled in the art according to specific application requirements and design requirements, as long as the uniformity and preparation yield of the first Josephson junction and the plurality of second Josephson junctions can be ensured.

Still referring to FIG. 6, at step 606, an insulating layer is formed on the first electrode layer. The insulating layer can include a compound corresponding to the material.

At step 608, the material is evaporated on the first pattern structure and the plurality of second pattern structures based on a second evaporation direction to generate a second electrode layer for implementing information transmission. The second evaporation direction can be substantially parallel (e.g., within an error range of ±2°) to the edge of the first pattern structure and the edge of the at least one of the plurality of second pattern structures.

In some embodiments, the material can be evaporated simultaneously on the first pattern structure and the plurality of second pattern structures based on the second evaporation direction to generate the second electrode layer. In some embodiments, the second electrode layer generated in the first pattern structure can be used to generate the first Josephson junction, and the second electrode layer generated in the plurality of second pattern structures can be used to generate the plurality of second Josephson junctions.

In some embodiments, the second evaporation direction can be substantially parallel to the edge of the first pattern structure and the edge of the at least one of the plurality of second pattern structures. By doing so, the influence of the evaporation angle and the photoresist thickness on the preparation quality of the Josephson junction can be reduced in the process of preparing the first Josephson junction and the plurality of second Josephson junctions. It should be noted that the second evaporation direction is not limited to the example embodiments described herein and can be select by those skilled in the art according to specific application requirements and design requirements, as long as the uniformity and preparation yield of preparing the first Josephson junction and the plurality of second Josephson junctions can be ensured. In some embodiments, the first evaporation direction can be perpendicular to the second evaporation direction. In some embodiments, the second evaporation direction can be approximately perpendicular to the first evaporation direction (e.g., within an error range of 1°, 2°, 5°, 10°, or any preset angle range).

Still referring to FIG. 6, at step 610, the first Josephson junction is formed based on the first electrode layer generated on the first pattern structure, the insulating layer, and the second electrode layer generated on the first pattern structure. The plurality of second Josephson junctions are formed based on the first electrode layer generated on the plurality of second pattern structures, the insulating layer, and the second electrode layer generated on the plurality of second pattern structures.

In some embodiments, the first Josephson junction can be formed as an overlapping structure that include the first electrode layer generated on the first pattern structure, the insulating layer, and the second electrode layer generated on the first pattern structure. Similarly, the plurality of second Josephson junctions can be formed as overlapping structures, each of the overlapping structures including the first electrode layer generated on the plurality of second pattern structures, the insulating layer, and the second electrode layer generated on the plurality of second pattern structures. By doing so, accurate and effective preparation operations on Josephson junctions can be effectively implemented.

As described above, by performing method 600, the first Josephson junction and the plurality of second Josephson junctions can be prepared simultaneously. Moreover, when the first electrode layer and the second electrode layer are generated, the first evaporation direction can be substantially parallel to the edge of the first pattern structure and the edge of the at least one of the plurality of second pattern structures, and the second evaporation direction can be substantially parallel to the edge of the first pattern structure and the edge of the at least one of the plurality of second pattern structures. By doing so, the influence of the evaporation direction or the thickness of the photoresist on the quality of the Josephson junction can be effectively reduced. Accordingly, the quality of the first Josephson junction and the plurality of second Josephson junctions can be ensured, and the uniformity and yield of preparing Josephson junctions can be improved.

FIG. 7 is a flowchart illustrating a method 700 of obtaining a first pattern structure and a plurality of second pattern structures, consistent with some embodiments of this disclosure. The first pattern structure can be used for generating the first Josephson junction of the first type as described in method 600, and the plurality of second pattern structures can be used for generating the plurality of second Josephson junctions of the second type as described in method 600.

At step 702, a mask plate is obtained for preparing a wafer-level Josephson junction. The mask plate can include a first mask region for preparing the first Josephson junction and a plurality of second mask regions for preparing the plurality of second Josephson junctions. At step 704, the first pattern structure is obtained through the first mask region, and the plurality of second pattern structures are obtained through the plurality of second mask regions.

Figure 8:
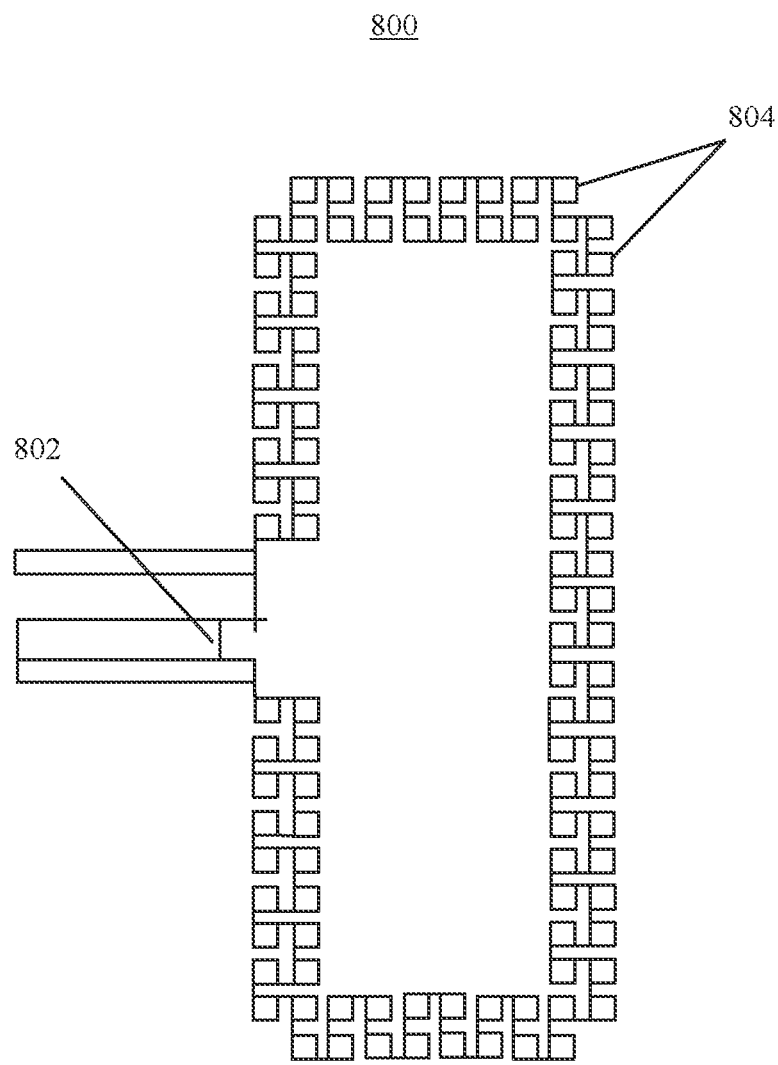
FIG. 8 is a schematic structural diagram of a mask plate, consistent with some embodiments of this disclosure.

FIG. 8 is a schematic structural diagram of a mask plate 800, consistent with some embodiments of this disclosure. Mask plate 800 can be used for preparing a wafer-level Josephson junction and can be preset. As shown in FIG. 8, mask plate 800 can include a first mask region 802 for preparing the first Josephson junction and second mask regions 804 for preparing the plurality of second Josephson junctions. It is understandable that the specific numbers of first mask region 802 and second mask regions 804 can be adjusted and set based on specific application scenarios and design requirements. In some embodiments, to prepare the plurality of second Josephson junctions described herein as being connected in series, second mask regions 804 can be connected in series. In some embodiments, to prepare the plurality of second Josephson junctions as being connected in parallel to the first Josephson junction, second mask regions 804 can be connected in parallel to first mask region 802.

By way of example, the first pattern structure can be obtained through first mask region 802, and the plurality of second pattern structures can be obtained through second mask regions 804. In some embodiments, to obtain the first pattern structure and the plurality of second pattern structures, a substrate structure can be obtained. A photoresist layer can be formed on the substrate structure. Then, etching can be performed on the photoresist layer through mask plate 800 to obtain the first pattern structure and the plurality of second pattern structures.

In some embodiments, to achieve a stable operation for preparing the Josephson junction, a preset substrate structure for generating the Josephson junction can be obtained. For example, the substrate structure can be a preset bare silicon wafer. After the substrate structure is obtained, a photoresist layer can be formed on the substrate structure. To ensure the quality of the pattern structure generated by the etching operation, in some embodiments, the photoresist layer generated on the substrate structure can be a double-layer structure. For example, the photoresist layer can include an upper photoresist layer and a lower photoresist layer, in which thickness of the upper photoresist layer can be greater than thickness of the lower photoresist layer. After the photoresist layer is generated, etching can be performed on the photoresist layer through a mask plate (e.g., mask plate 800) to obtain the first pattern structure and the plurality of second pattern structures. By doing so, the accuracy and reliability of obtaining the first pattern structure and the plurality of second pattern structures can be ensured.

Figure 9:
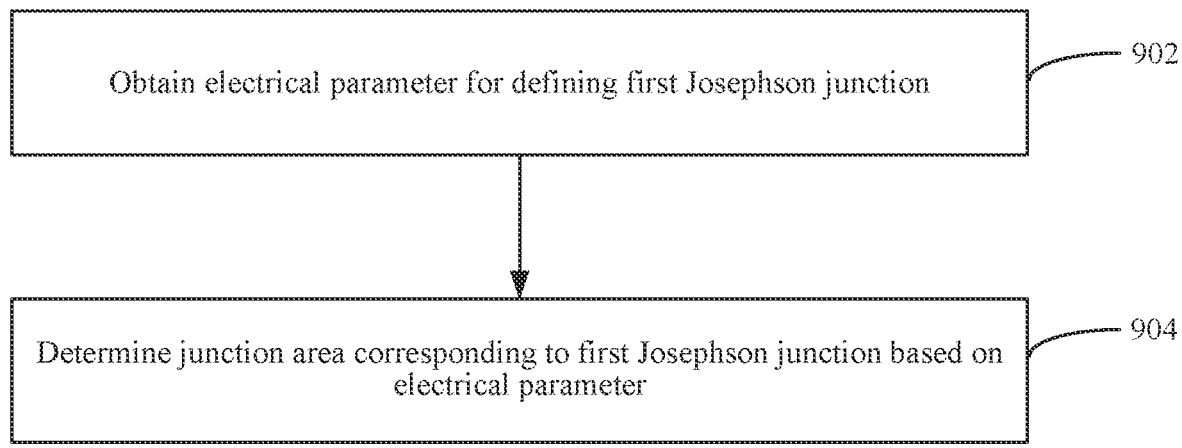
FIG. 9 is a flowchart of another method for preparing a Josephson junction, consistent with some embodiments of this disclosure.

FIG. 9 is a flowchart of a method 900 for preparing a Josephson junction, consistent with some embodiments of this disclosure. In some embodiments, method 900 can be performed in addition to method 600 for preparing the Josephson junction. At step 902, an electrical parameter for defining the first Josephson junction is obtained. At step 904, a junction area of the first Josephson junction is determined based on the electrical parameter. By performing method 900, Josephson junctions of the first type having different junction area sizes can be prepared corresponding to different electrical parameters so as to meet design requirements and application requirements of different users, thereby further improving the flexibility and reliability of preparing the first Josephson junction.

In some embodiments, the junction area of the first Josephson junction can be related to the electrical parameter. Obtaining the electrical parameter can ensure that the prepared first Josephson junction can meet the design requirements and usage requirements. In some embodiments, the electrical parameter can include at least one of electromagnetic field energy density, capacitance, or inductance. In some embodiments, the electrical parameter can be input by a user in advance or determined according to specific application scenarios and design requirements. By way of example, the user can directly input (e.g., through a user interface) the electrical parameter to an apparatus for implementing method 900. After the electrical parameter is obtained, the junction area of the first Josephson junction can be determined based on the electrical parameter.

In some embodiments, to determine the junction area of the first Josephson junction based on the electrical parameter, mapping relationships between different electrical parameters and different junction areas can be predetermined. After obtaining the electrical parameter, the mapping relationships can be used to determine the junction area of the first Josephson junction.

Figure 10:
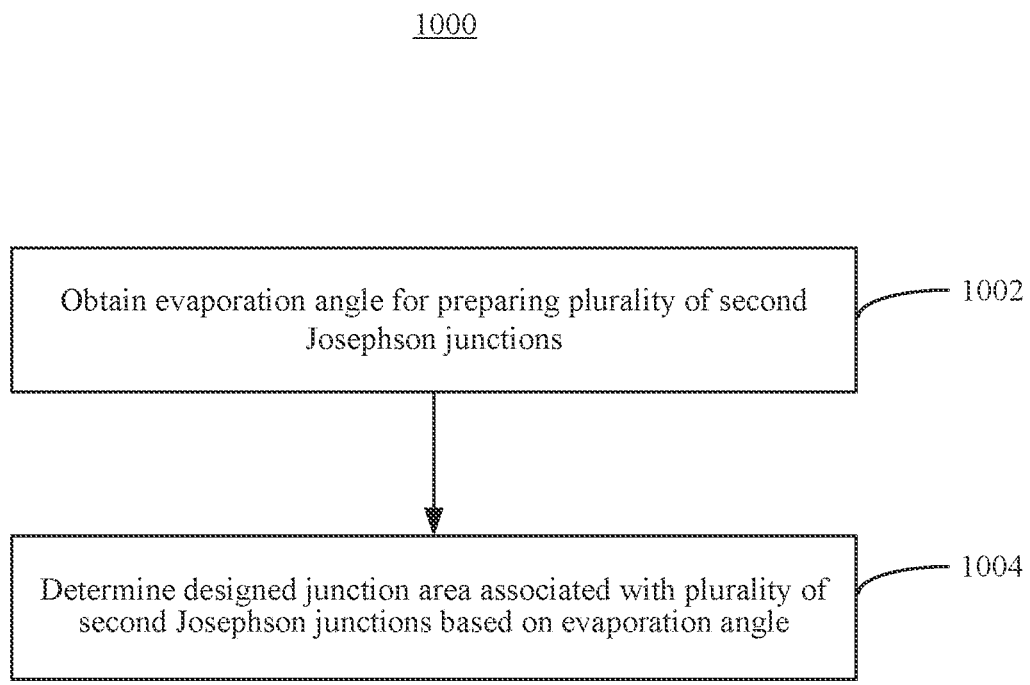
FIG. 10 is a flowchart of still another method for preparing a Josephson junction, consistent with some embodiments of this disclosure.

FIG. 10 is a flowchart of a method 1000 for preparing a Josephson junction, consistent with some embodiments of this disclosure. In some embodiments, method 1000 can be performed in addition to method 600 for preparing the Josephson junction. At step 1002, an evaporation angle is obtained for preparing the plurality of second Josephson junctions. The evaporation angle can correspond to at least one of the first evaporation direction or the second evaporation direction. At step 1004, a designed junction area associated with the plurality of second Josephson junctions is determined based on the evaporation angle.

In some embodiments, the plurality of second Josephson junctions can correspond to the designed junction area and a junction area (e.g., an actual junction area). By way of example, the designed junction area can be a theoretical junction area to be implemented by the plurality of second Josephson junctions, and the designed junction area and the junction area can be the same or different.

In some embodiments, the designed junction area associated with the plurality of second Josephson junctions can be related to the evaporation angle for preparing the plurality of second Josephson junctions. In some embodiments, the evaporation angle can include a first evaporation angle corresponding to the first evaporation direction or a second evaporation angle corresponding to the second evaporation direction.

In some embodiments, after being obtained, the evaporation angle can be analyzed and processed to determine the designed junction area associated with the plurality of second Josephson junctions. For example, to determine the designed junction area associated with the plurality of second Josephson junctions, thickness information of a photoresist layer for preparing the plurality of second Josephson junctions can be obtained. Then, the designed junction area can be determined based on the thickness information and the evaporation angle. The designed junction area can be greater than or equal to a junction area of at least one of the plurality of second Josephson junctions.

In some embodiments, to determine the designed junction area based on the thickness information and the evaporation angle, a cosine value corresponding to the evaporation angle can be obtained (e.g., after the evaporation angle is obtained). The product value of the cosine value and the thickness information can be determined. For example, the product value can be used as an area line corresponding to the designed junction area. Then, the designed junction area can be determined based on the product value. For example, the designed junction area can be determined as a square value of the product value.

Figure 11:
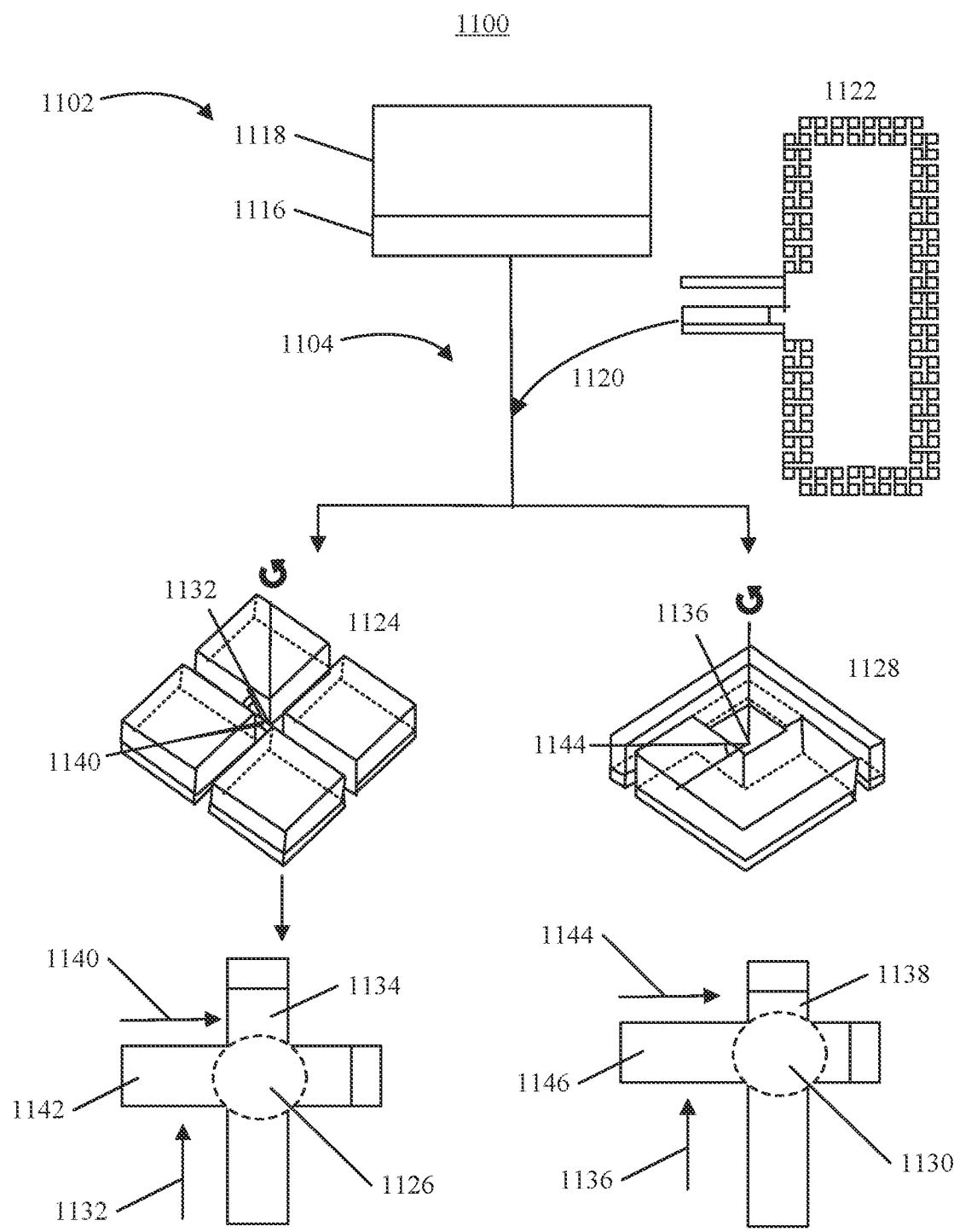
FIG. 11 is a schematic diagram illustrating a process of preparing a Josephson junction, consistent with some embodiments of this disclosure.

FIG. 11 is a schematic diagram illustrating a process 1100 of preparing a Josephson junction, consistent with some embodiments of this disclosure. Process 1100 can achieve simultaneous preparation of a plurality of Josephson junctions at the wafer level, and the plurality of Josephson junctions can include the first Josephson junction and the plurality of second Josephson junctions as described herein. For example, the first Josephson junction can refer to as a small junction with a junction area being smaller than or equal to a preset area, and the plurality of second Josephson junctions can refer to as big junctions with junction areas being greater than the preset area.

As shown in FIG. 11, at step 1102, a substrate material 1116 is obtained, and a double-layer photoresist layer 1118 is formed on substrate material 1116. In some embodiments, double-layer photoresist layer 1118 can include a top photoresist layer and a bottom photoresist layer (not shown in FIG. 11), in which thickness of the top photoresist layer can be greater than thickness of the bottom photoresist layer. By doing so, the quality and efficiency of generating the first pattern structure and the plurality of second pattern structures can be ensured.

As shown in FIG. 11, at step 1104, an etching operation 1120 is performed on double-layer photoresist layer 1118 through a mask plate 1122 to obtain a first pattern structure 1124 for generating a first Josephson junction 1126 (represented by an overlapping area enclosed by a dash-line oval in FIG. 11) of a first type and a plurality of second pattern structures 1128 for generating a plurality of second Josephson junctions 1130 (represented by an overlapping area enclosed by a dash-line oval in FIG. 11) of a second type. As shown in FIG. 11, first pattern structure 1124 can include a pattern area formed by four symmetrically arranged photoresist structure blocks, in which the sizes and shapes of the photoresist structure blocks are the same. There can be a predetermined distance between two adjacent photoresist structure blocks to form first pattern structure 1124, and the whole of first pattern structure 1124 can form a cross-shape structure.

As shown in FIG. 11, second pattern structures 1128 can include a pattern area formed by two photoresist structure blocks, in which the sizes and shapes of the two photoresist structure blocks are different. Specifically, one of the photoresist structure blocks has an L-shaped structure, the other photoresist structure block has an inverted-L-shaped structure, and there is a predetermined distance between the two photoresist structure blocks.

In some embodiments, in order to be able to prepare first Josephson junction 1126 and second Josephson junctions 1130 at the same time, arrangement directions of first pattern structure 1124 and second pattern structures 1128 on substrate material 1116 can be the same. For example, as shown in FIG. 11, a first evaporation direction 1132 of a first electrode layer 1134 for generating first Josephson junction 1126 can be the same as a first evaporation direction 1136 of a first electrode layer 1138 for generating second Josephson junctions 1130. A second evaporation direction 1140 of a second electrode layer 1142 for generating first Josephson junction 1126 can be the same as a second evaporation direction 1144 of a second electrode layer 1146 for generating second Josephson junctions 1130.

At step 1106 (not illustrated in FIG. 11), a material is loaded into an evaporation tool. The evaporation tool can be used to simultaneously evaporate the material on first pattern structure 1124 in first evaporation direction 1132 to generate first electrode layer 1134 and evaporate the material on second pattern structures 1128 in first evaporation direction 1136 (the same as first evaporation direction 1132) to generate first electrode layer 1138. First evaporation direction 1132 (the same as first evaporation direction 1136) can be substantially parallel (e.g., within an error range of 2°) to an edge of first pattern structure 1124 and an edge of at least one of second pattern structures 1128.

At step 1108 (not illustrated in FIG. 11), an insulating layer is formed on first electrode layer 1134 and first electrode layer 1138.

At step 1110 (not illustrated in FIG. 11), the evaporation tool is used to evaporate the material on first pattern structure 1124 based on second evaporation direction 1140 to generate second electrode layer 1142 and to evaporate the material on second pattern structures 1128 based on second evaporation direction 1144 (the same as second evaporation direction 1140) to generate second electrode layer 1146. Second evaporation direction 1144 (the same as second evaporation direction 1140) can be substantially parallel (e.g., within an error range of +2°) to another edge of first pattern structure 1124 and another edge of at least one of second pattern structures 1128.

In some embodiments, first evaporation direction 1132 (the same as first evaporation direction 1136) can be perpendicular to second evaporation direction 1140 (the same as second evaporation direction 1146) to ensure that the size information of the generated Josephson junction meets a preset requirement, and to prevent a line width size of the generated Josephson junction from becoming thinner.

At step 1112 (not illustrated in FIG. 11), double-layer photoresist layer 1118 is removed to obtain Josephson junctions, including first Josephson junction 1126 and second Josephson junctions 1130. First Josephson junction 1126 can include first electrode layer 1134, the insulating layer, and second electrode layer 1142. Second Josephson junction 1130 can include first electrode layer 1138, the insulating layer, and second electrode layer 1146.

It should be noted that, due to the correspondence between the junction area of first Josephson junction 1126 and electrical features (e.g., electromagnetic field energy density, capacitance, or inductance), when first Josephson junction 1126 is prepared by process 1100, the influence of the change in the photoresist thickness and the change in the evaporation angle on first Josephson junction 1126 can be effectively reduced. In such cases, the junction area of a Josephson junction can only be related to the line width corresponding to first pattern structure 1124, thus effectively ensuring high-quality preparation operation of the Josephson junctions.

After the Josephson junction is generated, mask plate 1122 can be removed. In some embodiments, mask plate 1122 can be removed using an organic solvent or a high-frequency vapor phase etching method. Those skilled in the art can use other methods to remove mask plate 1122, as long as it ensures that mask plate 1122 can be removed stably and effectively, which will not be detailed herein.

At step 1114 (not illustrated in FIG. 11), after first Josephson junction 1126 and second Josephson junctions 1130 are obtained, first Josephson junction 1126 and second Josephson junctions 1130 can be used to prepare a superconducting device. By way of example, second Josephson junctions 1130 can be connected in series, and second Josephson junctions 1130 can be connected in parallel to first Josephson junction 1126, so that a superconducting device with an adjustable magnetic flux can be generated. The superconducting device can have a long correlation time.

The technical solution described in association with FIG. 11 can ensure that first Josephson junction 1126 and second Josephson junctions 1130 are prepared simultaneously. Moreover, during generation of a first electrode layer (e.g., first electrode layer 1134 or first electrode layer 1138) and a second electrode layer (e.g., second electrode layer 1142 or second electrode layer 1146), a first evaporation direction (e.g., first evaporation direction 1132 or first evaporation direction 1136) can be substantially parallel (e.g., within an error range of 2°) to an edge of first pattern structure 1124 and an edge of at least one of second pattern structures 1128. Also, during generation of the first electrode layer and the second electrode layer, a second evaporation direction (e.g., second evaporation direction 1140 or second evaporation direction 1144) can be substantially parallel (e.g., within an error range of 2°) to another edge of first pattern structure 1124 and another edge of at least one of second pattern structures 1128. By doing so, the influence of the evaporation direction or the influence of the thickness of the photoresist on the quality of the Josephson junction (e.g., an area of the Josephson junction, a critical current of the Josephson junction, or a non-superconducting normal-state resistance of the Josephson junction) can be reduced. Accordingly, the quality of first Josephson junction 1126 and second Josephson junctions 1130 can be ensured, and the uniformity and yield of preparing Josephson junctions can be improved.

Figure 12:
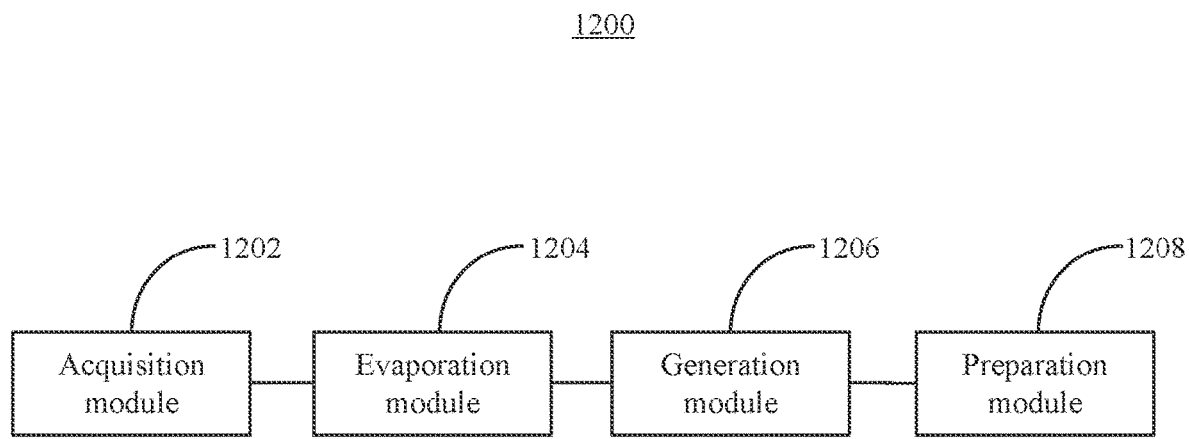
FIG. 12 is a schematic structural diagram illustrating an apparatus for preparing a Josephson junction, consistent with some embodiments of this disclosure.

FIG. 12 is a schematic structural diagram illustrating an apparatus 1200 for preparing a Josephson junction, consistent with some embodiments of this disclosure. Apparatus 1200 can be used for preparing a wafer-level Josephson junction. In some embodiments, apparatus 1200 can perform any of methods 600, 700, 900, or 1000 described in association with FIGS. 6-7 and FIGS. 9-10. As shown in FIG. 12, apparatus 1200 can include an acquisition module 1202, an evaporation module 1204, a generation module 1206, and a preparation module 1208. It should be noted that acquisition module 1202, evaporation module 1204, generation module 1206, and preparation module 1208 can be implemented as software modules, hardware modules (e.g., including circuitry), or a combination of software modules and hardware modules.

Acquisition module 1202 can be configured to obtain a first pattern structure for generating a first Josephson junction of a first type and a plurality of second pattern structures for generating a plurality of second Josephson junctions of a second type. A junction area of the first Josephson junction can be different from a junction area of at least one of the plurality of second Josephson junctions.

Evaporation module 1204 can be configured to cause apparatus 1200 to evaporate a material on the first pattern structure and the plurality of second pattern structures based on a first evaporation direction to generate a first electrode layer for implementing information transmission. The first evaporation direction can be substantially parallel (e.g., within an error range of 2°) to an edge of the first pattern structure and an edge of at least one of the plurality of second pattern structures.

Generation module 1206 can be configured to cause apparatus 1200 to form an insulating layer on the first electrode layer. The insulating layer can include a compound corresponding to the material.

Evaporation module 1204 can be further configured to cause apparatus 1200 to evaporate the material on the first pattern structure and the plurality of second pattern structures based on a second evaporation direction to generate a second electrode layer for implementing information transmission. The second evaporation direction can be substantially parallel (e.g., within an error range of 2°) to the edge of the first pattern structure and the edge of the at least one of the plurality of second pattern structures.

Preparation module 1208 can be configured to cause apparatus 1200 to form the first Josephson junction based on the first electrode layer generated on the first pattern structure, the insulating layer, and the second electrode layer generated on the first pattern structure, and to form the plurality of second Josephson junctions based on the first electrode layer generated on the plurality of second pattern structures, the insulating layer, and the second electrode layer generated on the plurality of second pattern structures.

In some embodiments, the junction area of the first Josephson junction can be smaller than or equal to a preset area, and the junction area of the at least one of the plurality of second Josephson junctions can be greater than the preset area.

In some embodiments, to obtain the first pattern structure and the plurality of second pattern structures, acquisition module 1202 can be configured to cause apparatus 1200 to obtain a mask plate for preparing a wafer-level Josephson junction. The mask plate can include a first mask region for preparing the first Josephson junction and a plurality of second mask regions for preparing the plurality of second Josephson junctions. Acquisition module 1202 can be further configured to cause apparatus 1200 to obtain the first pattern structure through the first mask region, and to obtain the plurality of second pattern structures through the plurality of second mask regions.

In some embodiments, to obtain the first pattern structure and the plurality of second pattern structures, acquisition module 1202 can be further configured to cause apparatus 1200 to obtain a substrate structure, to form a photoresist layer on the substrate structure, and to perform etching on the photoresist layer through the mask plate to obtain the first pattern structure and the plurality of second pattern structures.

In some embodiments, acquisition module 1202 can be configured to cause apparatus 1200 to obtain an electrical parameter for defining the first Josephson junction. Evaporation module 1204 can be configured to determine a junction area of the first Josephson junction based on the electrical parameter. By way of example, the electrical parameter can include at least one of electromagnetic field energy density, capacitance, or inductance.

In some embodiments, acquisition module 1202 can be configured to cause apparatus 1200 to obtain an evaporation angle for preparing the plurality of second Josephson junctions. The evaporation angle can correspond to at least one of the first evaporation direction or the second evaporation direction. Evaporation module 1204 can be configured to determine a designed junction area associated with the plurality of second Josephson junctions based on the evaporation angle.

In some embodiments, to determine the designed junction area, evaporation module 1204 can be further configured to cause apparatus 1200 to obtain thickness information of the photoresist layer for preparing the plurality of second Josephson junctions, and to determine the designed junction area based on the thickness information and the evaporation angle. The designed junction area can be greater than or equal to a junction area of at least one of the plurality of second Josephson junctions.

In some embodiments, to determine the designed junction area, evaporation module 1204 can be further configured to obtain a cosine value corresponding to the evaporation angle, to determine the product value of the cosine value and the thickness information, and to determine the designed junction area based on the product value.

In some embodiments, an angle formed between the first evaporation direction and a gravity direction is greater than or equal to 10°, and less than or equal to 60°. In some embodiments, the first evaporation direction is perpendicular to the second evaporation direction. In some embodiments, the plurality of second Josephson junctions are connected in series, and the first Josephson junction is connected in parallel to the plurality of second Josephson junctions. In some embodiments, the material comprises at least one of aluminum, binary nitride, ternary nitride, or composite oxide.

Figure 13A:
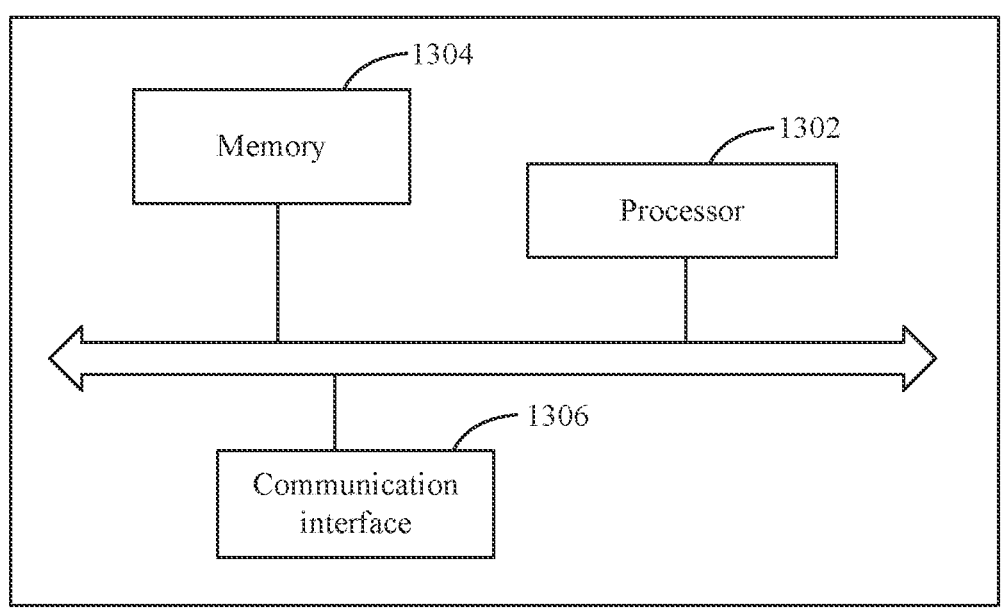
FIG. 13A is a schematic structural diagram illustrating an electronic device for preparing a Josephson junction, consistent with some embodiments of this disclosure.

Consistent with some embodiments of this disclosure, the structure of apparatus 1200 in FIG. 12 can be implemented as an electronic device. The electronic device can include various devices such as a mobile phone, a tablet computer, or a server. FIG. 13A is a schematic structural diagram illustrating an electronic device 1300A for preparing a Josephson junction, consistent with some embodiments of this disclosure. As shown in FIG. 13A, electronic device 1300A can include a processor 1302 and a memory 1304. Memory 1304 can be used to store a program (e.g., including one or more computer instructions) for electronic device 1300A to perform a method for preparing a Josephson junction, such as methods 600, 700, 900, or 1000 described in association with FIGS. 6-7 and FIGS. 9-10. Processor 1302 can be configured to execute the program stored in memory 1304. Electronic device 1300A can also include communication interface 1306 for electronic device 1300A to communicate with another device or a communication network.

Figure 13B:
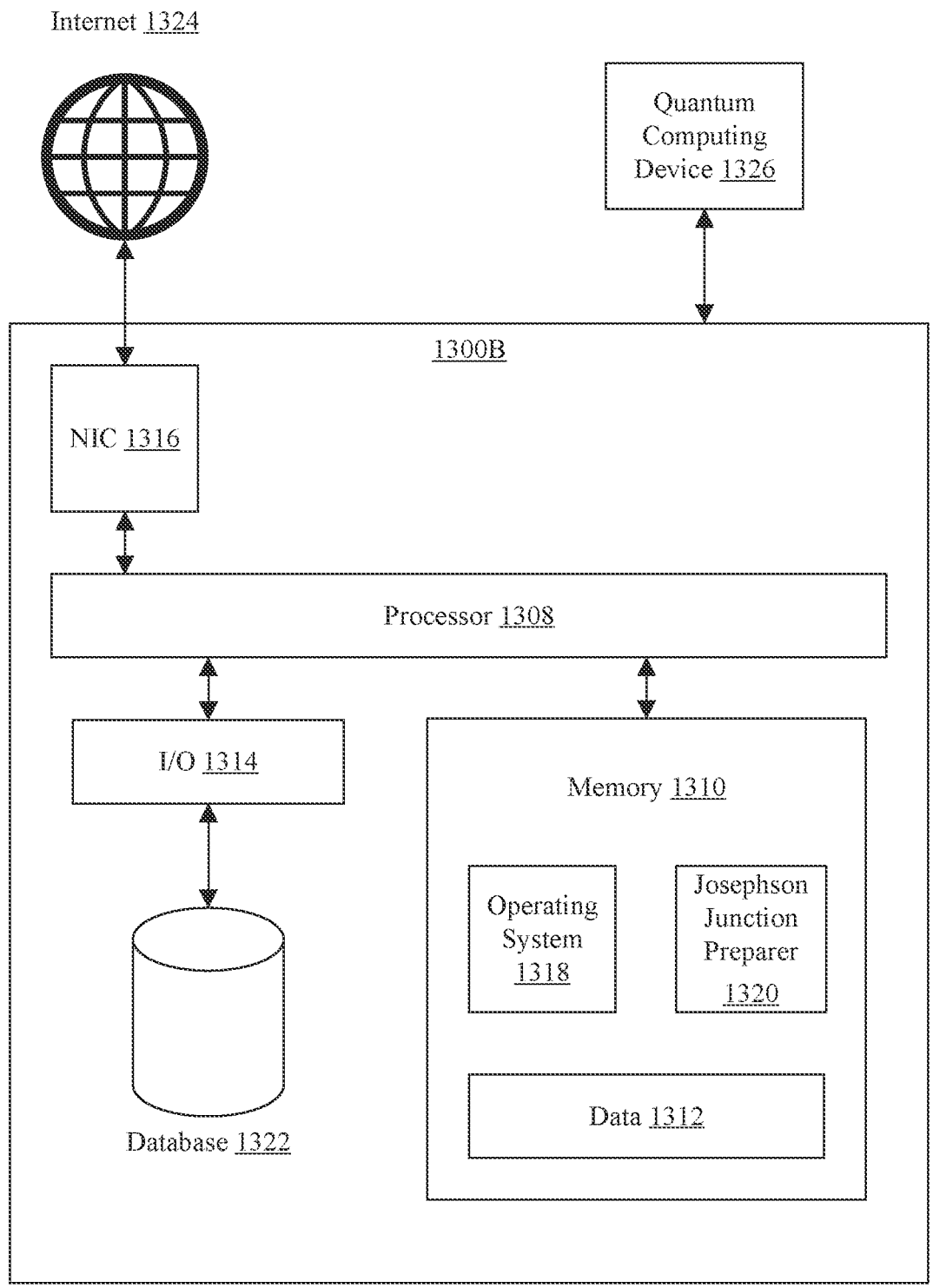
FIG. 13B is a block diagram of an example system for operating a quantum circuit, consistent with some embodiments of this disclosure.

Consistent with some embodiments of this disclosure, FIG. 13B is a block diagram of an example system 1300B for operating a quantum circuit, consistent with some embodiments of this disclosure. In some embodiments, system 1300B can include a computer (e.g., a classical computer) configured to execute operations for operating a quantum circuit as described in association with FIGS. 6-12. As depicted in FIG. 13B, system 1300B includes a processor 1308 that can be in operable connection with a memory 1310, an input/output (I/O) module 1312, and a network interface controller (NIC) 1316.

When processor 1308 executes instructions described herein, system 1300B can become a specialized machine for preparing a Josephson junction. Processor 1308 can be any type of circuitry capable of manipulating or processing information. For example, processor 1308 can include any combination of any number of a central processing unit (or "CPU"), a graphics processing unit (or "GPU"), a neural processing unit ("NPU"), a microcontroller unit ("MCU"), an optical processor, a programmable logic controller, a microcontroller, a microprocessor, a digital signal processor, an intellectual property (IP) core, a Programmable Logic Array (PLA), a Programmable Array Logic (PAL), a Generic Array Logic (GAL), a Complex Programmable Logic Device (CPLD), a Field-Programmable Gate Array (FPGA), a System On Chip (SoC), an Application-Specific Integrated Circuit (ASIC), or the like. In some embodiments, processor 1308 can also be a set of processors (not shown in FIG. 13B) grouped as a single logical component.

Memory 1310 can include a single memory or a plurality of memories that can be configured to store data 1312 (e.g., a set of instructions, computer codes, intermediate data, or data for output). Memory 1310 can include a high-speed random-access storage device or a non-volatile storage device. In some embodiments, memory 1310 can include any combination of any number of a random-access memory (RAM), a read-only memory (ROM), an optical disc, a magnetic disk, a hard drive, a solid-state drive, a flash drive, a security digital (SD) card, a memory stick, a compact flash (CF) card, or the like. Memory 1310 can also be a group of memories (not shown in FIG. 13B) grouped as a single logical component. Processor 1308 can access the program instructions and data 1312, and execute the program instructions to perform an operation or manipulation on data 1312. As depicted in FIG. 13B, memory 1310 can store an operating system 1318 and a Josephson junction preparer 1320. For example, Josephson junction preparer 1320 can include instructions to implement the method described in association with FIGS. 6-12 to prepare a Josephson junction.

For ease of explanation without causing ambiguity, processor 1308 and other data processing circuits are collectively referred to as a "data processing circuit" in this disclosure. The data processing circuit can be implemented entirely as hardware, or as a combination of software, hardware, or firmware. In addition, the data processing circuit can be a single independent module or can be combined entirely or partially into any other component of system 1300B.

Input/output module (I/O) 1314 can store and retrieve data from a database 1322. For example, database 1322 can include data structures describing quantum circuits and data structures describing quantum gates. NIC 1316 can provide wired or wireless communication between system 1300B and a network (e.g., Internet 1324, an intranet, a local area network, a mobile communications network, or the like). System 1300B can receive data and instructions over a network using NIC 1316 and can transmit data and instructions over a network using NIC 1316. In some embodiments, NIC 1316 can include any combination of a radio frequency (RF) module, a transponder, a transceiver, a modem, a router, a gateway, a wired network adapter, a wireless network adapter, a Bluetooth adapter, an infrared adapter, a near-field communication ("NFC") adapter, or a cellular network chip.

As depicted in FIG. 13B, system 1300B can also communicatively couple with (e.g., via I/O 1314 or NIC 1316) a quantum computing device 1326. In some embodiments, system 1300B can be a classical computer (e.g., a desktop computer, a laptop computer, or a tablet computer) that is independent from quantum computing device 1326. In some embodiments, system 1300B can include classical computing devices (e.g., processor 1308, memory 1310, I/O 1314, NIC 1316, or database 1322) and quantum computing devices (e.g., including quantum computing device 1326). Quantum computing device 1326 can include any number of any type of quantum circuits (that include quantum gates) for operating on qubits as well as peripheral devices (e.g., cryostats, laser generators, electric oscillators) for maintaining and supporting the quantum circuits. In some embodiments, quantum computing device 1326 can include hardware components functioning as a quantum data plane for preparing and storing qubits, a control and measurement plane for executing operations on the qubits and measuring the resulting qubits, and a control processor plane for determining the sequence of operations and measurements based on an algorithm or measurement outcomes. When system 1300B is a classical computer, it can assist quantum computing device 1326 for network access (e.g., via NIC 1316), large storages (e.g., using database 1316), and user interactions (e.g., via I/O 1314).

Figure 13C:
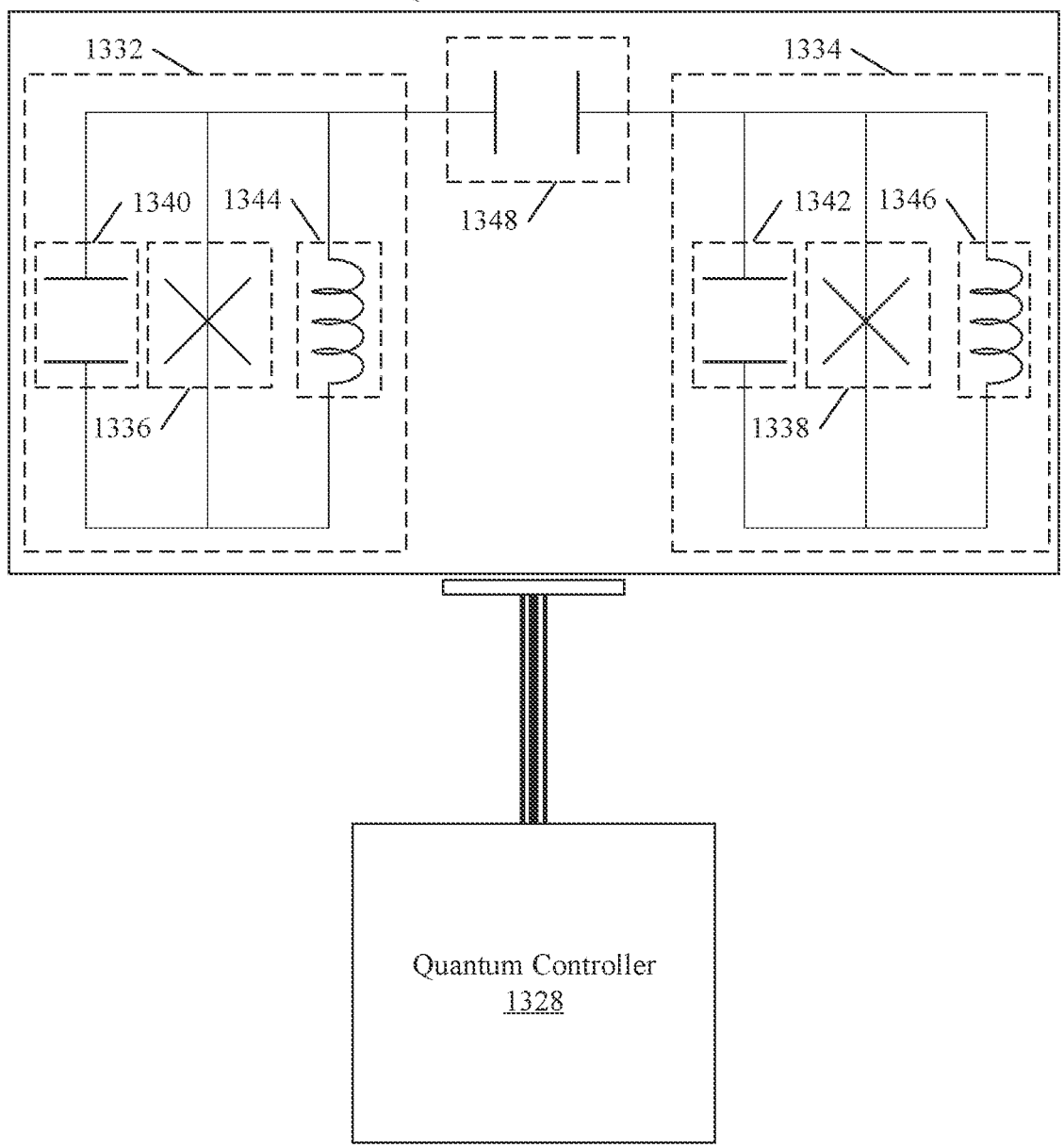
FIG. 13C is a schematic diagram illustrating an example quantum controller for operating quantum circuits, consistent with some embodiments of this disclosure.

Consistent with some embodiments of this disclosure, FIG. 13C is a schematic diagram illustrating an example quantum controller 1328 for operating (e.g., controlling qubits for computation, controlling qubits for compiling, or any manipulation of qubit) quantum circuits (e.g., quantum circuit 1330, as shown). Quantum circuit 1330 can include one or more qubits. In the non-limiting example depicted in FIG. 13C, quantum circuit 1330 can include qubits 1332 and 1334. For example, qubits 1332 and 1334 can be fluxonium qubits. To continue this example, each of qubits 1332 and 1334 can be implemented using a Josephson junction (e.g., Josephson junction 1336 or 1338) shunted by a capacitor (e.g., capacitor 1340 or 1342) and an inductor (e.g., inductor 1344 or 1346). Each of inductors 1344 and 1346 can be realized by an array of Josephson junctions (not shown in FIG. 13C). Each of qubits 1334 and 1334 can be constructed to operate at a local minimum in frequency with regards to a biasing magnetic flux. In this non-limiting example, qubits 1332 and 1334 can be coupled using a capacitor 1348, implementing transverse resonant coupling (e.g., charge-coupled, or the like) between qubits 1334 and 1334. Such coupling can require alignment of the qubit frequencies. When quantum circuit 1330 is not in operation, qubits 1332 and 1334 can be maintained as different frequencies.

In some embodiments, quantum circuit 1330 can be realized using a chip containing qubits 1332 and 1334 as well as their coupling in between. In some embodiments, quantum circuit 1330 can be implemented as a chip in quantum computing device 1326 in FIG. 13B.

In some embodiments, the chip can include one of more couplings to a quantum controller 1328. Quantum controller 1328 can be a digital computing device (e.g., a computing device including a central processing unit, graphical processing unit, application specific integrated circuit, field-programmable gate array, or other suitable processor). Quantum controller 1328 can configure quantum circuit 1330 for computation (e.g., by manipulating qubits 1332 and 1334), provide computational gates, or read state information out of quantum circuit 1330.

Consistent with some embodiments of this disclosure, quantum controller 1328 can configure quantum circuit 1330 by enabling a gate operation to be performed on one or more qubits of circuit quantum 1330 (e.g., including qubits 1332 and 1334). In some embodiments, quantum circuit 1330 can be configured by providing one or more bias drives to move two qubits into resonance. Quantum controller 1328 can provide the one or more bias drives directly to circuit 1330, or can provide instructions to a bias drive source (e.g., waveform generator or the like), causing the bias drive source to provide the bias drives to circuit 1330. In some embodiments, providing the bias drive can include passing a current through a coil external to circuit 1330. In various embodiments, providing the bias drive can include passing a current through a coil on the chip. The disclosed embodiments are not limited to a particular method of providing the bias drive or a particular method of biasing the qubits.

Consistent with some embodiments of this disclosure, quantum controller 1328 can implement computational gates on circuit 1330. Quantum controller 1328 can implement such gates by providing one or more computational drives to corresponding qubits in circuit 1330, or by providing instructions to a computation drive source (e.g., a waveform generator or the like), causing the computational drive source to provide the one or more computational drives to circuit 1330. Such computational drives can include microwave drives. The computational drives can include sinusoidal waves, square waves, pulse trains, or other quantum gate drives having parameters selected by the quantum controller 1328 to implement quantum gates on the qubits. The one or more computational drives can be provided to the corresponding qubits using one or more coils coupled to the corresponding qubits. The coils can be external to circuit 1330 or on a chip containing circuit 1330.

Consistent with some embodiments of this disclosure, quantum controller 1328 can be configured to determine state information for quantum circuit 1330. In some embodiments, quantum controller 1328 can measure a state of one or more qubits of circuit 1330. The state can be measured upon completion of a sequence of one or more quantum operations. In some embodiments, quantum controller 1328 can provide a probe signal (e.g., a microwave probe tone) to a coupled resonator of circuit 1330, or provide instructions to a readout device (e.g., an arbitrary waveform generator) that provides the probe signal. In various embodiments, quantum controller 1328 can include, or be configured to receive information from, a detector configured to determine an amplitude and phase of an output signal received from the coupled resonator in response to provision of the microwave probe tone. The amplitude and phase of the output signal can be used to determine the state of the probed qubit(s). The disclosed embodiments are not limited to any particular method of measuring the state of the qubits.

The disclosed embodiments are not limited to embodiments in which quantum controller 1328 controls only a single quantum circuit. In some embodiments, quantum controller 1328 can control multiple quantum circuits (which can be identical in implementation or can differ in implementation). For example, quantum controller 1328 can control a first, transmon-qubit-based quantum circuit and a second, fluxonium-qubit-based quantum circuit. In some embodiments, quantum controller 1328 can be capable of independently controlling the multiple quantum circuits. In some instances, for example, each of the multiple quantum circuits can be performing different, contemporaneous computations. In various instances, the multiple quantum circuit can be involved in the same computation (e.g., parallel computations, or the like).

Consistent with some embodiments of this disclosure, quantum controller 1328 can configure quantum circuit 1330, and can provide computational gates to circuit 1330, based at least in part on the obtained state information. In some embodiments, quantum controller 1328 can be included as part of computing device 1326 in FIG. 13B.

Figure 14:
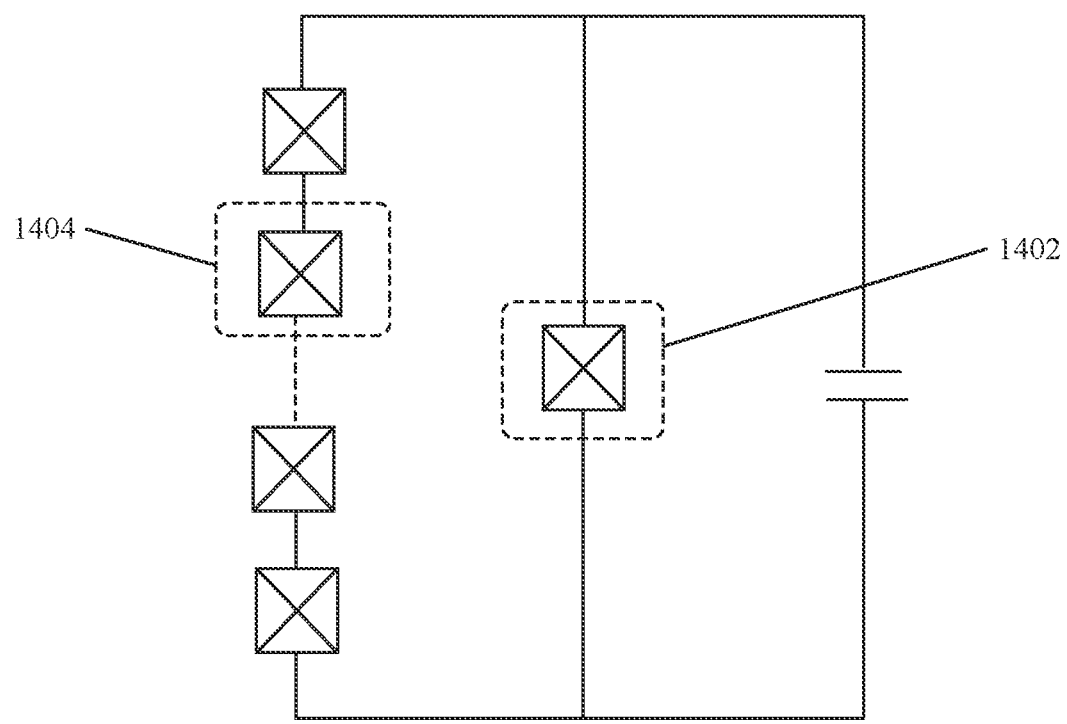
FIG. 14 is a schematic diagram illustrating a superconducting device, consistent with some embodiments of this disclosure.

FIG. 14 is a schematic diagram illustrating a superconducting device 1400, consistent with some embodiments of this disclosure. In some embodiments, the magnetic flux of superconducting device 1400 can be controllable. As shown in FIG. 14, superconducting device 1400 can include a first Josephson junction 1402 of a first type connected in parallel to a plurality of second Josephson junctions 1404 a second type. Second Josephson junctions 1404 are connected in series. By way of example, first Josephson junction 1402 and second Josephson junctions 1404 can be generated by performing at least one of methods 600, 700, 900, or 1000 described in association with FIGS. 6-7 and FIGS. 9-10.

Consistent with some embodiments of this disclosure, a non-transitory computer-readable storage medium for storing computer software instructions used by an apparatus is provided herein. The non-transitory computer-readable storage medium can include programs for performing a method for preparing a Josephson junction or process disclosed herein (e.g., methods 600, 700, 900, or 1000 described in association with FIGS. 6-7 and FIGS. 9-10).

The embodiments can further be described using the following clauses:

1. A method for preparing a Josephson junction, the method comprising:
    obtaining a first pattern structure for generating a first Josephson junction of a first type and a plurality of second pattern structures for generating a plurality of second Josephson junctions of a second type, wherein a junction area of the first Josephson junction is different from a junction area of at least one of the plurality of second Josephson junctions;
    evaporating a material on the first pattern structure and the plurality of second pattern structures based on a first evaporation direction to generate a first electrode layer for implementing information transmission, wherein the first evaporation direction is substantially parallel to an edge of the first pattern structure and an edge of at least one of the plurality of second pattern structures;
    forming an insulating layer on the first electrode layer, the insulating layer comprising a compound corresponding to the material;
    evaporating the material on the first pattern structure and the plurality of second pattern structures based on a second evaporation direction to generate a second electrode layer for implementing information transmission, wherein the second evaporation direction is substantially parallel to the edge of the first pattern structure and the edge of the at least one of the plurality of second pattern structures; and
    forming the first Josephson junction based on the first electrode layer generated on the first pattern structure, the insulating layer, and the second electrode layer generated on the first pattern structure, and forming the plurality of second Josephson junctions based on the first electrode layer generated on the plurality of second pattern structures, the insulating layer, and the second electrode layer generated on the plurality of second pattern structures.

2. The method of clause 1, wherein the junction area of the first Josephson junction is smaller than or equal to a preset area, and the junction area of the at least one of the plurality of second Josephson junctions is greater than the preset area.

3. The method of any of clauses 1-2, wherein obtaining the first pattern structure for generating the first Josephson junction of the first type and the plurality of second pattern structures for generating the plurality of second Josephson junctions of the second type comprises:
    obtaining a mask plate for preparing a wafer-level Josephson junction, the mask plate comprising a first mask region for preparing the first Josephson junction and a plurality of second mask regions for preparing the plurality of second Josephson junctions; and
    obtaining the first pattern structure through the first mask region, and obtaining the plurality of second pattern structures through the plurality of second mask regions.

4. The method of clause 3, wherein obtaining the first pattern structure through the first mask region, and obtaining the plurality of second pattern structures through the plurality of second mask regions comprises:
    obtaining a substrate structure;
    forming a photoresist layer on the substrate structure; and
    performing etching on the photoresist layer through the mask plate to obtain the first pattern structure and the plurality of second pattern structures.

5. The method of clause 4, wherein the photoresist layer comprises an upper photoresist layer and a lower photoresist layer.

6. The method of clause 5, wherein thickness of the upper photoresist layer is greater than thickness of the lower photoresist layer.

7. The method of any of clauses 1-6, further comprising:
    obtaining an electrical parameter for defining the first Josephson junction; and
    determining a junction area of the first Josephson junction based on the electrical parameter.

8. The method of clause 7, wherein the electrical parameter comprises at least one of electromagnetic field energy density, capacitance, or inductance.

9. The method of any of clauses 1-8, further comprising:
    obtaining an evaporation angle for preparing the plurality of second Josephson junctions, wherein the evaporation angle corresponds to at least one of the first evaporation direction or the second evaporation direction; and
    determining a designed junction area associated with the plurality of second Josephson junctions based on the evaporation angle.

10. The method of clause 9, wherein determining the designed junction area associated with the plurality of second Josephson junctions based on the evaporation angle comprises:
    obtaining thickness information of a photoresist layer for preparing the plurality of second Josephson junctions; and
    determining the designed junction area based on the thickness information and the evaporation angle, wherein the designed junction area is greater than or equal to a junction area of at least one of the plurality of second Josephson junctions.

11. The method of clause 10, wherein determining the designed junction area based on the thickness information and the evaporation angle comprises:
    obtaining a cosine value corresponding to the evaporation angle;
    determining a product value of the cosine value and the thickness information; and
    determining the designed junction area based on the product value.

12. The method of any of clauses 9-11, wherein the evaporation angle comprises a first evaporation angle corresponding to the first evaporation direction or a second evaporation angle corresponding to the second evaporation direction.

13. The method of any of clauses 1-12, wherein an angle formed between the first evaporation direction and a gravity direction is greater than or equal to 10°, and less than or equal to 60°.

14. The method of any of clauses 1-13, wherein the first evaporation direction is perpendicular to the second evaporation direction.

15. The method of any of clauses 1-14, wherein the plurality of second Josephson junctions are connected in series, and the first Josephson junction is connected in parallel to the plurality of second Josephson junctions.

16. The method of any of clauses 1-15, wherein the material comprises at least one of aluminum, binary nitride, ternary nitride, or composite oxide.

17. An apparatus for preparing a Josephson junction, the apparatus comprising at least one circuitry configured for:

obtaining a first pattern structure for generating a first Josephson junction of a first type and a plurality of second pattern structures for generating a plurality of second Josephson junctions of a second type, wherein a junction area of the first Josephson junction is different from a junction area of at least one of the plurality of second Josephson junctions;

causing the apparatus to evaporate a material on the first pattern structure and the plurality of second pattern structures based on a first evaporation direction to generate a first electrode layer for implementing information transmission, wherein the first evaporation direction is substantially parallel to an edge of the first pattern structure and an edge of at least one of the plurality of second pattern structures;

causing the apparatus to form an insulating layer on the first electrode layer, the insulating layer comprising a compound corresponding to the material;

causing the apparatus to evaporate the material on the first pattern structure and the plurality of second pattern structures based on a second evaporation direction to generate a second electrode layer for implementing information transmission, wherein the second evaporation direction is substantially parallel to the edge of the first pattern structure and the edge of the at least one of the plurality of second pattern structures; and causing the apparatus to form the first Josephson junction based on the first electrode layer generated on the first pattern structure, the insulating layer, and the second electrode layer generated on the first pattern structure, and to form the plurality of second Josephson junctions based on the first electrode layer generated on the plurality of second pattern structures, the insulating layer, and the second electrode layer generated on the plurality of second pattern structures.

18. A device for preparing a Josephson junction, the device comprising:
at least one processor; and
a memory configured to store one or more computer instructions executable by the at least one processor to cause the device to perform:
obtaining a first pattern structure for generating a first Josephson junction of a first type and a plurality of second pattern structures for generating a plurality of second Josephson junctions of a second type, wherein a junction area of the first Josephson junction is different from a junction area of at least one of the plurality of second Josephson junctions;
evaporating a material on the first pattern structure and the plurality of second pattern structures based on a first evaporation direction to generate a first electrode layer for implementing information transmission, wherein the first evaporation direction is substantially parallel to an edge of the first pattern structure and an edge of at least one of the plurality of second pattern structures;
forming an insulating layer on the first electrode layer, the insulating layer comprising a compound corresponding to the material;
evaporating the material on the first pattern structure and the plurality of second pattern structures based on a second evaporation direction to generate a second electrode layer for implementing information transmission, wherein the second evaporation direction is substantially parallel to the edge of the first pattern structure and the edge of the at least one of the plurality of second pattern structures; and
forming the first Josephson junction based on the first electrode layer generated on the first pattern structure, the insulating layer, and the second electrode layer generated on the first pattern structure, and forming the plurality of second Josephson junctions based on the first electrode layer generated on the plurality of second pattern structures, the insulating layer, and the second electrode layer generated on the plurality of second pattern structures.

19. A superconducting circuit including a first Josephson junction of a first type connected in parallel to a plurality of second Josephson junctions of a second type, wherein the plurality of second Josephson junctions are connected in series, and wherein the first Josephson junction and the plurality of second Josephson junctions are generated by a method, the method comprising:
obtaining a first pattern structure for generating a first Josephson junction of a first type and a plurality of second pattern structures for generating a plurality of second Josephson junctions of a second type, wherein a junction area of the first Josephson junction is different from a junction area of at least one of the plurality of second Josephson junctions;
evaporating a material on the first pattern structure and the plurality of second pattern structures based on a first evaporation direction to generate a first electrode layer for implementing information transmission, wherein the first evaporation direction is substantially parallel to an edge of the first pattern structure and an edge of at least one of the plurality of second pattern structures;
forming an insulating layer on the first electrode layer, the insulating layer comprising a compound corresponding to the material;
evaporating the material on the first pattern structure and the plurality of second pattern structures based on a second evaporation direction to generate a second electrode layer for implementing information transmission, wherein the second evaporation direction is substantially parallel to the edge of the first pattern structure and the edge of the at least one of the plurality of second pattern structures; and
forming the first Josephson junction based on the first electrode layer generated on the first pattern structure, the insulating layer, and the second electrode layer generated on the first pattern structure, and forming the plurality of second Josephson junctions based on the first electrode layer generated on the plurality of second pattern structures, the insulating layer, and the second electrode layer generated on the plurality of second pattern structures.

20. The superconducting circuit of clause 19, wherein a magnetic flux of the superconducting circuit is controllable.

It should be noted that the example apparatuses and devices described herein are only schematic, where the units described as separate components can or cannot be physically separated, and the components displayed as units can or cannot be physical units (e.g., can be located in one place, or can be distributed to a plurality of network units). Part or all of the modules can be selected in accordance with actual needs to achieve the purpose of the solution of the present embodiment. Those of ordinary skill in the art can understand and implement the solution of the present embodiment without creative effort.

From the description of the above implementations, those skilled in the art can clearly understand that the various implementations can be implemented by means of software plus a necessary hardware platform, and can also be implemented by a combination of hardware and software. Based on such understanding, the above technical solution essentially or the part contributing to the prior art can be embodied in the form of a computer product. The present disclosure can be in the form of a computer program product implemented on one or more computer-usable storage media (including, but not limited to, a magnetic disk memory, a CD-ROM, an optical memory, and the like) including computer usable program code.

The present disclosure is described with reference to flowcharts or block diagrams of methods, devices, systems, and computer program products in accordance with embodiments of the present disclosure. It should be understood that each flow or block in the flowcharts or block diagrams and a combination of flows or blocks in the flowcharts or block diagrams can be implemented by computer program instructions. These computer program instructions can be provided to a processor of a general-purpose computer, a special-purpose computer, an embedded processor, or another programmable device to produce a machine, so that the instructions executed by the processor of the computer or another programmable device produce an apparatus for realizing the functions specified in one or more flows of the flowcharts or one or more blocks of the block diagrams.

These computer program instructions can also be stored in a non-transitory computer-readable memory that can direct a computer or another programmable device to work in a specific manner, so that the instructions stored in this computer-readable memory produce an article of manufacture including an instruction apparatus which implements the functions specified in one or more flows of the flowcharts or one or more blocks of the block diagrams.

These computer program instructions can also be loaded onto a computer or another programmable device, so that a series of operation steps are performed on the computer or another programmable device to produce computer-implemented processing, so that the instructions executed on the computer or another programmable device provide steps for implementing the functions specified in one or more flows of the flowcharts or one or more blocks of the block diagrams.

In a typical configuration, the computing device includes one or more processors (CPUs), an input/output interface, a network interface, and a memory. The memory can include a volatile memory, a random access memory (RAM), or a non-volatile memory in computer-readable media, e.g., a read-only memory (ROM) or a flash RAM. The memory is an example of the computer-readable medium.

The non-transitory computer-readable medium can include permanent or non-permanent, removable or non-removable media, which can implement storage of information by using any method or technology. The information can be computer-readable instructions, data patterns, program modules, or other data. Examples of computer storage media include, but are not limited to, a phase change memory (PRAM), a static random access memory (SRAM), a dynamic random access memory (DRAM), other type of random access memory (RAM), a read-only memory (ROM), an electrically erasable programmable read-only memory (EEPROM), a flash memory or other memory technologies, a compact disc read-only memory (CD-ROM), a digital versatile disc (DVD) or other optical storage, a cassette magnetic tape, tape and disk storage or other magnetic storage devices, or any other non-transmission media, which can be configured to store information accessible by a computing device. As defined herein, the non-transitory computer-readable medium does not include computer-readable transitory media, such as a modulated data signal and a carrier.

Finally, it should be noted that the above embodiments are only used to illustrate the technical solutions of the present disclosure, and are not intended to limit the present disclosure. Although the present disclosure has been described in detail with reference to the foregoing embodiments, those of ordinary skill in the art should understand that the technical solutions recorded in the foregoing various embodiments can still be modified, or some of the technical features thereof can be equivalently replaced. These modifications or replacements do not cause the essence of the corresponding technical solutions to deviate from the spirit and scope of the technical solutions of the embodiments of the present disclosure.

What is claimed is:

1. A method for use in fabricating a superconducting circuit, the method comprising:
    obtaining an etched substrate comprising (i) a first pattern structure for generating a first Josephson junction of a first type and (ii) a plurality of second pattern structures for generating a plurality of second Josephson junctions of a second type;
    wherein a junction area of the first Josephson junction is different from a junction area of at least one of the plurality of second Josephson junctions;
    evaporating a material on the first pattern structure and the plurality of second pattern structures based on a first evaporation direction to generate a first electrode layer, wherein the first evaporation direction is substantially parallel to an edge of the first pattern structure and an edge of at least one of the plurality of second pattern structures;
    forming an insulating layer on the first electrode layer, the insulating layer comprising a compound corresponding to the material;
    evaporating the material on the first pattern structure and the plurality of second pattern structures based on a second evaporation direction to generate a second electrode layer, wherein the second evaporation direction is substantially parallel to the edge of the first pattern structure and the edge of the at least one of the plurality of second pattern structures; and
    forming the first Josephson junction based on the first electrode layer generated on the first pattern structure, the insulating layer, and the second electrode layer generated on the first pattern structure, and forming the plurality of second Josephson junctions based on the first electrode layer generated on the plurality of second pattern structures, the insulating layer, and the second electrode layer generated on the plurality of second pattern structures.

2. The method of claim 1, wherein the junction area of the first Josephson junction is smaller than the junction area of the at least one of the plurality of second Josephson junctions.

3. The method of claim 1, wherein obtaining the first pattern structure for generating the first Josephson junction of the first type and the plurality of second pattern structures for generating the plurality of second Josephson junctions of the second type comprises:
    obtaining a mask plate for use in fabricating the superconducting circuit, the mask plate comprising a first mask region for fabricating the first Josephson junction and a plurality of second mask regions for fabricating the plurality of second Josephson junctions; and obtaining the first pattern structure using the first mask region, and obtaining the plurality of second pattern structures using the plurality of second mask regions.

4. The method of claim 3, wherein obtaining the first pattern structure using the first mask region, and obtaining the plurality of second pattern structures using the plurality of second mask regions comprises:

obtaining the substrate;

forming a photoresist layer on the substrate; and generating the etched substrate by performing etching on the photoresist layer through the mask plate to obtain the first pattern structure and the plurality of second pattern structures.

5. The method of claim 4, wherein the photoresist layer comprises an upper photoresist layer and a lower photoresist layer.

6. The method of claim 5, wherein thickness of the upper photoresist layer is greater than thickness of the lower photoresist layer.

7. The method of claim 1, further comprising:

receiving a specified an electrical parameter for defining the first Josephson junction; and determining a junction area of the first Josephson junction based on the electrical parameter.

8. The method of claim 7, wherein the electrical parameter comprises at least one of electromagnetic field energy density, capacitance, or inductance.

9. The method of claim 1, wherein a first evaporation angle corresponds to the first evaporation direction or a second evaporation angle corresponds to the second evaporation direction.

10. The method of claim 1, wherein an angle formed between the first evaporation direction and a principal gravity direction is greater than or equal to 10°, and less than or equal to 60°.

11. The method of claim 1, wherein the first evaporation direction is perpendicular to the second evaporation direction.

12. The method of claim 1, wherein the second pattern structure configures the plurality of second Josephson junctions for connection in series, and the first pattern structure configures the first Josephson junction for connection in parallel to the plurality of second Josephson junctions.

13. The method of claim 1, wherein the material comprises at least one of aluminum, binary nitride, ternary nitride, or composite oxide.

14. The method of claim 1, wherein the superconducting circuit comprises a fluxonium qubit.

* * * * *